(12) United States Patent
Martin et al.

(10) Patent No.: US 7,078,994 B2
(45) Date of Patent: Jul. 18, 2006

(54) CONSTANT POWER AND TEMPERATURE COIL

(76) Inventors: Glenn Henry Martin, 5803 Contented Ln., Amarillo, TX (US) 79109; Ronald L Rohde, 6012 Canning St., Oakland, CA (US) 94609; John O. H. Nisownger, 28947 Thousand Oaks Blvd. #212, Agoura Hills, CA (US) 91301

( * ) Notice: Subject to any disclaimer, the term of this patent is extended or adjusted under 35 U.S.C. 154(b) by 189 days.

(21) Appl. No.: 10/781,208

(22) Filed: Feb. 17, 2004

(65) Prior Publication Data

US 2004/0164831 A1 Aug. 26, 2004

Related U.S. Application Data

(60) Provisional application No. 60/448,842, filed on Feb. 17, 2003.

(51) Int. Cl.
*H01F 27/08* (2006.01)

(52) U.S. Cl. .............................. 336/61; 336/57; 336/62; 336/60; 336/180

(58) Field of Classification Search ................... 336/60, 336/61, 62, 57, 180; 310/254, 256; 165/30, 165/47
See application file for complete search history.

(56) References Cited

U.S. PATENT DOCUMENTS

| | | | |
|---|---|---|---|
| 3,851,172 A | 11/1974 | Osasa et al. | |
| 4,345,152 A | 8/1982 | Gerlach | |
| 4,384,208 A | 5/1983 | Tsuno | |
| 4,400,622 A | 8/1983 | Takeuchi et al. | |
| 4,544,847 A | 10/1985 | Taylor | |
| 4,817,706 A * | 4/1989 | Harumi et al. | 165/263 |
| 5,164,626 A * | 11/1992 | Oigawa | 310/208 |
| 5,442,182 A | 8/1995 | Kubo et al. | |
| 6,661,327 B1 * | 12/2003 | Funk | 336/212 |
| 6,852,982 B1 | 2/2005 | Bierhoff et al. | |

* cited by examiner

*Primary Examiner*—Lincoln Donovan
*Assistant Examiner*—Jennifer A. Poker

(57) ABSTRACT

A coil apparatus is described that incorporates two or more conductors, wound in parallel, following the same path, in intimate physical contact throughout the path but electrically isolated. The current applied to each of the coils can be selected independently. The field generated by the coil, or force on the coil in a magnetic field, is proportional to the algebraic sum of the currents. The power applied to the coil is proportional to the sum of square of the currents. By independently selecting the appropriate current's to apply to each of the conductors, a desired field, or force, can be generated by the coil for any desired power applied to the coil. By judiciously selecting appropriate currents to apply to each of the conductors, a range of fields, or forces, may be selected for which a constant power may be applied to the coil. A constant power enables the coil to operate at a constant temperature.

4 Claims, 13 Drawing Sheets

CONSTANT POWER AND TEMPERATURE COIL

CROSS-REFERENCE TO RELATED APPLICATION

This invention is based on U.S. Provisional Patent Application Ser. No. 60/448,842 filed Feb. 18, 2003 entitled "CONSTANT POWER AND TEMPERATURE COIL" filed in the name of Glenn Henry Martin, Ronald L. Rohde, and John O. H. Niswonger. The priority of this application is hereby claimed and it is hereby incorporated herein by reference thereto.

FIELD OF THE INVENTION

The present invention generally relates to generation of a magnetic field, or application of a current within an externally induced magnetic field, while holding the temperature of the current elements at a constant temperature by application of a constant power. More particularly, this invention relates to charged particle beam exposure methods and apparatuses. Even more particularly this invention relates to a charged particle beam exposure method which is suited to achieving a stable, high resolution pattern over a wide range of deflection fields at a high rate of throughput. Even more particularly, this invention relates to a charged particle beam exposure apparatus which generates a wide range of magnetic deflection fields for exposing patterns onto a substrate at a high rate of throughput. Even more particularly, this invention relates to a charged particle beam exposure apparatus which generates a wide range of magnetic lens fields for adjusting the size of the beam. Even more particularly, this invention relates to application of current to current elements within an externally induced magnetic field, such as electric motors and pumps, etc.

BACKGROUND OF THE INVENTION

Particle beam lithography equipment, such as an electron beam pattern generating machine, uses magnetic lenses, magnetic centering coils, and magnetic deflection coils to focus, position, and deflect a charged particle beam respectively. In the case of a typical electron beam pattern generating machine, for example, the charged particle is an electron beam. Magnetic lenses focus the beam and adjust its size and intensity as it passes through various apertures. Magnetic centering coils position the beam within the lenses and relative to the apertures or lenses. Magnetic deflection coils position the beam on the substrate. A special form of the magnetic lens is the stigmation lens. This is a magnetic octapole, made up of eight different lens type coils or poles, which focus the electron beam independently in the X and the Y axis. All of these coils are part of a column. They surround or are inside an evacuated chamber which contains the electron beam.

The magnetic deflection coils for the X and the Y axis are stacked together in what is referred to as a deflection stack, or simply a stack. Typically a 10–100 KV electron beam is deflected over a maximum deflection field, or scan length, of about 0.1 to 10 mm. For example, in deflecting a 50 KV electron beam, a typical current through the coils in a deflection stack along with the resistance of those coils would result in approximately 10 watts of power being applied to the deflection stack to produce a scan deflection of 1 mm. But at a current necessary to produce a scan deflection of 0.5 mm the power applied to the same deflection stack would be only 2.5 watts.

Similarly, current to the lenses is changed to vary focal length, which in turn varies the spot size and intensity of the electron beam as it passes through apertures. Current to the centering drives is changed to adjust the beam position relative to apertures or lenses within the column. As these currents are changed, power to lenses and centering coils will vary by many watts.

The temperature of a coil is, to a first approximation, a function of the power applied to the coil and the rate of heat dissipation of the coil. A change in power applied to the lenses, stigmation coils, centering coils, or deflection stack results in a temperature change within the coil and the column as a new dynamic equilibrium is reached. As the temperature of the deflection stack changes the coils within the stack change shape and position. As the temperature of the lenses, stigmation coils, and centering coils change these coils also change shape and position. These mechanical changes in shape and position result in a change in the electron beam position, size, intensity, and scan length at the substrate.

Temperature change in the material of the coils will also result in a change in the coil resistance. These resistance changes will effect the strength of the fields being generated by the coils. Changes in the field strength of any of the coils in the column, as a result of temperature change, can result in a change in the electron beam position, spot current, spot shape, and spot size. These effects are often referred to as "temperature drift" because they can take many minutes to settle out and are similar to electrostatic or charge drift.

The actual temperature at which the coils, and more generally the column, operate is generally not a problem. The problem is first, with the differences between the initial and final temperatures as a new spot size, intensity or scan deflection is selected. The second part of the problem is the rate at which the coils reach a stable temperature after these changes have been made. A resultant position change as a function of temperature change is rather small, typically on the order of fractions of a micron. However, when trying to hold accuracy of beam position to within a few nanometers, a change in the position of the beam, the scan length or the beam deflection, of hundreds or even tens of nanometers can be very serious and result in the degradation of the quality of a pattern being written by the electron beam on a substrate. The degradation of pattern quality can be so severe, when temperature driven beam drift results in only a few tens of nanometers of beam position change, that a pattern on a very expensive mask becomes useless. Likewise temperature drift can cause changes in spot current, spot size and spot shape which can render a pattern on a very expensive mask useless.

Vector particle beam machines are particularly sensitive to this problem. The amount of beam position deflection is very pattern dependent. As the pattern changes, the average deflection, and therefore the average power applied to the deflection coils, changes. This constant variation of average power applied to the deflection coils makes it very difficult to control the internal temperature of the coils and column. As a result, the response of the deflection coils to current drive depends on the history of pattern which has just been written.

Deflection stack coils of an electron beam pattern generating machine are tightly wound and typically encased inside of a solid metal cylinder. So there is little opportunity for dissipating the power which is being applied to the coils. Any path for energy to leave the coils is very slow. It has long been the practice in the industry to use fluid to control the temperature of deflection coils. Fluid, such as flourinert (a magnetically inert fluid) is flowed through heat exchange elements positioned in close proximity to the deflection stack. This forms a system consisting of the deflection stack, a reservoir of fluid at a temperature somewhat below the stack temperature, a heater in the fluid, and the heat exchange elements. Often this is thought of as cooling the deflection coils. What is really happening though is that the total power applied to the system is held constant by adjusting the power applied to the heater in the fluid to match the power applied to the coils in the deflection stack, such that the sum of those two components is approximately constant. Typically this is accomplished by using a Proportional-Integral-Differential loop (or PID loop) to control the duty cycle of a heater in the fluid loop. Temperature of the deflection stack can be used as an input in determining that duty cycle. The size of the deflection field can also be used as a kind of feed forward input in determining that duty cycle.

However, this method has significant drawbacks. The heat exchange elements (or sometimes called 'cooling elements') cannot be placed very close to coils in the stack. As a result the heat transfer between the coils and the heat exchange elements is still slow. Consequently, hot and cold spots build up within the coil. If there is too much difference between the amount of power supplied to the system by the coils and the amount of power supplied to the system by the heat exchange elements, the coils will still undergo local changes in temperature internally, even though constant power is being applied to the system and the system may stay at a constant global temperature. As a result, temperature drift still occurs.

Furthermore, control of the power applied to the fluid loop must be calibrated over a wide operating range. This is time consuming and often inaccurate. Even with carefully adjusted PID loops for the fluid cooling, the stack temperature can change by over one degree Celsius when changing the scan length (or average deflection) from 1 mm to 0.5 mm. It can take as long as thirty minutes for stack temperature to stabilize while a beam drift of hundreds of nanometers is occurring. While it is possible to wait for the temperature to stabilize, this results in a significant cost in throughput. Moreover, in calibrating beam size, position, linearity, length and rotation, it is often necessary to use multiple scan lengths. This can be like aiming at a moving target.

Other attempts to control the stack temperature include placing the heater in close proximity to the deflection stack, instead of upstream in the 'cooling loop'. This was widely experimented with back in the mid 1980's. In this method the system consists of just the deflection stack and the heater. The heater is again driven at an appropriate power such that the total power applied to the system is again held constant. [Recently U.S. Pat. No. 5,382,800 was issued to cover this very old technique] In principle this is the same method as using a fluid cooling system to adjust the total power applied to the system, which had been widely in use in the industry for many years prior to the '800 patent. The difference is simply that the heater is placed next to the coils instead of being separated by a fluid. Thus heat is transferred directly from the heater to the coils instead of being transmitted through a fluid. The advantage of using this arrangement is that the power applied by the heater directly to the system can be changed more rapidly. There is also a little shorter lag time or phase shift between the time power is applied to the system and the effects of that power. The problem with this method is the same as with fluid cooling. There is still a path between the coils and the heater for the energy to flow along. This results in hot and cold spots. Control of the supplemental power has to be calibrated. This is also time consuming and approximate at best. Finally, while the time lag of seconds is somewhat shorter than a time lag of minutes, it is still very long on the scale of microseconds at which particle beam machines move the beam around.

Similarly the temperature of lens coils and centering coils can be controlled by active systems, as described above for stack cooling, including PID loops and thermal exchange mechanisms. Generally, though, temperature control of lens and centering coils is concentrated mainly in controlling the temperature of the driving electronics and amplifiers while the temperatures of the actual lenses and centering coils are not addressed. This is because the thermal time constants for these coils to come to equilibrium is generally believed to be much shorter than that of the deflection stack. Moreover, lenses and centering coils are not adjusted as often as deflection fields.

Even more generally the same problems are encountered in electrical servo motors for positioning a stage holding a substrate under the particle beam. As power to servo motors varies, the stage and substrate temperature is affected. A stage temperature change of only one degree Celsius can cause an expansion of the substrate by as much as one micron. This invention applies to building a servo motor wherein the power applied to motor coils can be controlled independently of the field generated by the coils.

Even more generally, the same problems may be encountered in many electrical coils producing magnetic fields where temperature control is critical. This invention can be applied to any coil producing a magnetic field where it is desired to control the power applied to the coil independently of the field produced by the coil. Or stated another way, this invention can be applied to any coil producing a magnetic field where it is desired to control the temperature produced by the coil independently of the field produced by the coil.

Even more generally, the same problems may be encountered in a device where a current element is placed in an externally induced magnetic field to produce a force or other linear effect. This invention can be applied to control the power applied to the current element, and therefore temperature of the device using the current element, independent of the force or other linear effect.

SUMMARY OF THE INVENTION

Accordingly, it is the general object of the present invention to provide a novel and useful magnetic coil for generating magnetic fields in which the problems described above are eliminated.

A more specific object of the present invention is to provide a novel and useful deflection coil for generating magnetic fields in which the problems described above are eliminated.

Another more specific object of the present invention is to provide a novel and useful lens coil for generating magnetic fields which form lenses for particle beams which pass through them, in which the problems described above are eliminated.

Another more specific object of the present invention is to provide a novel and useful centering coil for generating magnetic fields which are used for centering or positioning a particle beam with respect to apertures, lenses and other parts of a particle beam apparatus, in which the problems described above are eliminated.

Another more specific object of the present invention is to provide a novel and useful stigmation coil for generating magnetic fields used to focus a particle beam, differentially and independently in the X and the Y axis, in which the problems described above are eliminated.

Another more specific object of the present invention is to provide a novel and useful current element operating within an externally induced magnetic field which is used for producing linear effects, as a function of the current in the element, in which the problems described above are eliminated.

Another more specific object of the present invention is to provide a charged particle beam exposure apparatus containing a magnetic lens comprising a plurality of coil conductors or windings, which are wound in parallel, together and aligned in the same axis. Current can be applied to each of these windings independently. The focal length is, to a first approximation, the algebraic sum of the magnetic fields generated by each of the windings. The current and thus magnetic field strength of each winding can be negative or positive. Since the magnetic field generated by each winding is directly proportional to the current applied to a winding, the total focal length of the lens is directly proportional to the linear sum of currents applied independently to each of the windings. However the power applied to each winding is directly proportional to the square of the current applied to the winding, and thus is always a positive quantity. Therefore the total power applied to the lens is directly proportional to the sum of the square of the currents applied independently to each winding. The current applied to each of the windings is then independently selected such that any desired total focal length can be achieved while the total power applied to the coil remains at a desired or constant power. By winding the plurality of the windings together, the path between windings which are generating the power is minimal. Thus the internal temperature of each of the coils remains constant at all focal lengths. There is no delay while waiting for the temperature to stabilize after changing the focal length.

Another more specific object of the present invention is to provide a charged particle beam exposure apparatus comprising a plurality of deflection coil windings which are wound together, in parallel, and aligned in the axis of the deflection coil. Current can be applied to each of these windings independently. The total deflection is, to a first approximation, the algebraic sum of the magnetic fields generated by each of the windings. Since the magnetic field is directly proportional to the current applied to a winding, deflection of the beam, is directly proportional to the linear sum of the currents applied independently to each of the windings. The current and thus direction of the beam deflection can be negative or positive. However the power applied to each winding is directly proportional to the square of the current applied to the winding, and thus is always a positive quantity. Therefore the total power applied to the deflection coil is directly proportional to the sum of the square of the currents applied independently to each winding. The current applied to each winding independently is then selected such that the desired total deflection can be achieved for any scan length while the total power applied to the coil remains at a desired constant or power. By keeping the plurality of coil windings parallel and together, the path between windings as they are generating the power is minimal. Thus the temperature of the deflection coil remains constant. There is no delay while waiting for the temperature to stabilize after changing the scan length or deflection. A plurality of deflection coils, as described above, can each be independently aligned in any desired axis to position the beam with respect at the substrate, as desired.

Another more specific object of the present invention is to provide a charged particle beam exposure apparatus comprising a plurality of centering coil windings which are wound together, in parallel, and aligned in the axis of the centering coil. Current can be applied to each of these windings independently. The total deflection is, to a first approximation, the algebraic sum of the magnetic fields generated by each of the windings. Since the magnetic field is directly proportional to the current applied to a winding, deflection of the beam, is directly proportional to the linear sum of the currents applied independently to each of the windings. The current and thus direction of the beam deflection can be negative or positive. However the power applied to each winding is directly proportional to the square of the current applied to the winding, and thus is always a positive quantity. Therefore the total power applied to the centering coil is directly proportional to the sum of the square of the currents applied independently to each winding. The current applied to each winding independently is then selected such that the desired total deflection can be achieved for any desired beam position within the column, while the total power applied to the coil remains at a desired constant power. By keeping the plurality of coil windings parallel and together, the path between windings as they are generating the power is minimal. Thus the temperature of the centering coil remains constant. There is no delay while waiting for the temperature to stabilize after changing the position. A plurality of centering coils, as described above, can each be independently aligned in any desired axis to position the beam with respect to apertures or lenses, as desired.

Another more specific object of the present invention is to provide an apparatus comprising a plurality of current elements which are arrayed together, in parallel, and aligned with each other within an externally induced magnetic field. Current can be applied to each of these current elements independently. The total physical effect, such as force or torque resulting from that current is, to a first approximation, the algebraic sum of the currents applied to each of the current elements. Since the physical effect is directly proportional to each of the currents applied to each of the current elements, the total effect, is directly proportional to the linear sum of the currents applied independently to each of the current elements. The current and thus sign of the physical effect can be negative or positive. However the power applied to each current element is directly proportional to the square of the current applied to that current element, and thus is always a positive quantity. Therefore the total power applied to the device is directly proportional to the sum of the square of the currents applied independently to each current element. The current applied to each current element independently is then selected such that the desired total physical effect can be achieved while the total power applied to the current elements remains at a desired or constant power. By keeping the plurality of current elements parallel and together, the path between current elements as they are generating the power is minimal. Thus the temperature of the device remains constant. There is no delay while waiting for the temperature to stabilize after changing the drives to the current elements.

Still another more specific object of the present invention is to provide a charged particle beam exposure method for focusing a charged particle beam in a particle beam system which includes an electromagnetic lens comprising a plurality coil windings, wound in parallel and together, comprising the steps of: applying current to each of a plurality of windings of the lens coil to focus the charged particle beam; and selecting the current to apply to each of the plurality of windings of the lens coil such that the total power applied to the lens coil is constant and the desired total resultant focal length is achieved. Since the power generated by the sum of the plurality of windings of the lens coil, is constant at all focal lengths, the temperature of the lens coil remains constant. Thus there is no resultant change in position or focal length of the lens coil when changing the focal length. There is no need to wait for the temperature of the stack to stabilize when the focal length is changed.

Still another more specific object of the present invention is to provide a charged particle beam exposure method for deflecting a charged particle beam in a deflection system which includes an electromagnetic deflection coil comprising a plurality coil windings, wound in parallel and together, comprising the steps of: applying a separate and independently selected current to each of a plurality of deflection coil windings to deflect the charged particle beam; and selecting the current to apply independently to each of the plurality of windings of the deflection coil such that the sum total power applied to the plurality coils is constant while the desired total resultant deflection is achieved. Since the power generated by the sum of the plurality of windings of the deflection is constant at all scan lengths or deflections, the temperature of the deflection stack remains at the desired constant temperature. Thus there is no resultant change in position or scan length of the deflection field due to temperature changes. There is no need to wait for the temperature of the stack to stabilize when the scan length or deflection is changed.

Still another more specific object of the present invention is to provide a method for producing a magnetic field which includes a magnetic coil comprising a plurality coil windings, wound in parallel and together, comprising the steps of: applying a separate and independent current to each of a plurality of windings of the centering coil, to create a desired magnetic field which is proportional to the algebraic sum of the applied currents, and selecting a current to apply independently to each of the plurality of windings of the centering coil such that the sum total power applied to the plurality coils is constant while the desired total resultant magnetic field is achieved. Since the power generated by the sum of the plurality of the coil windings, is constant at all desired magnetic fields, the temperature of the centering coil remains constant.

Still another more specific object of the present invention is to provide a method for producing a physical effect in an externally induced magnetic filed which includes a current element comprising a plurality conductors, arrayed in parallel and following the identical path together, comprising the steps of: applying a separate and independent current to each of a plurality of conductors, to create the desired physical effect which is proportional to the algebraic sum of the applied currents, and selecting a current to apply independently to each of the plurality of conductors such that the sum total power applied to the plurality coils is constant while the desired total resultant physical effect is achieved. Since the power generated by the sum of the plurality of the conductors, is constant at all desired physical effects, the temperature of the current element remains constant.

Other objects and further features of the present invention will be apparent from the following detailed description when read in conjunction with accompanying drawings.

DESCRIPTION OF THE PREFERRED EMBODIMENT

Figure 1:
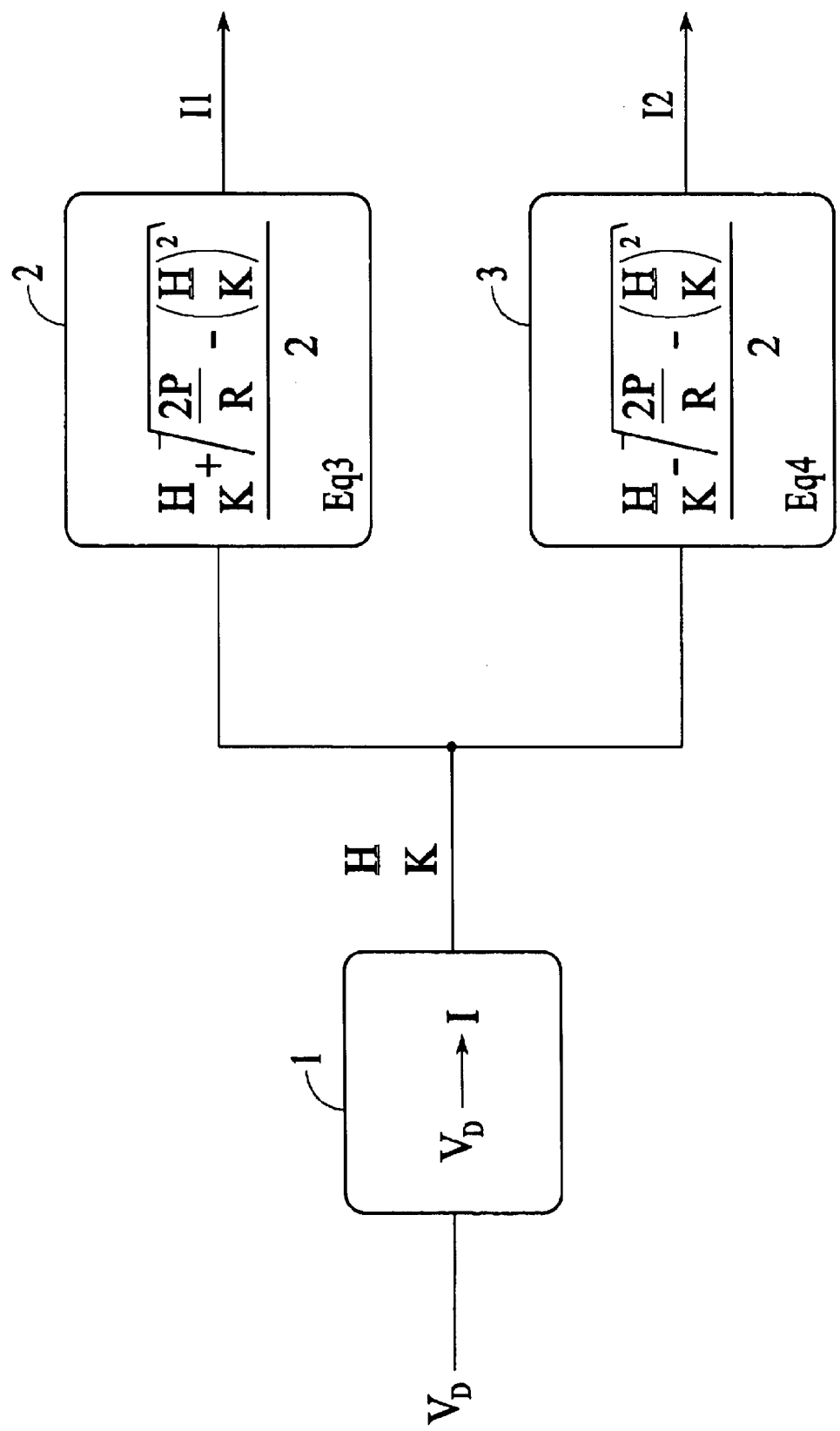
FIG. 1 shows in block form the analog generation of Equations 3 and 4

First, a description will be given of the operating principle of the present invention by referring to FIG. 1 through FIG. 13. A magnetic coil is normally wound with a single continuous strand of conducting material, typically wire. In this invention, a magnetic coil is wound in the normal manner except that multiple strands of parallel conductors or wires are wound through the same path that the single strand would have been wound. For the sake of simplicity we will treat the case where only two conductors are used to construct the coil and the conductors are made of wires. The wires are kept in intimate physical, but not electrical, contact throughout winding such that they are both following the same path at all times. The intimate physical contact assures that heat energy will be transferred uniformly and quickly between the wires. Thus at any given point along the pair of wires, both wires will always be at the same temperature. Preventing electrical contact is necessary such that each of the wires may be energized independently. It is not necessary that both wires be of the same gage but again, for the sake of simplicity, we will consider the case where both strands of wire, making up the pair which are wound into the coil, are of the same gauge. One continuous strand will make up a First Conductor of the coil. A second continuous strand will make up a Second Conductor of the coil. The ends of the First Conductor and the Second Conductor are kept separate for connecting to separate circuits. This is depicted diagrammatically in FIGS. 4 through 8. Conductors 4A, 4C, 4E, 4G, and 4J are the First Conductors of Coils D4, L4, C4, S4, and G4 respectively. Conductors 4B, 4D, 4F, 4H, and 4K are the Second Conductors of Coils D4, L4, C4, S4, and G4 respectively.

Current I1 is applied to the First Conductor and is independent of a current I2 which is applied to the Second Conductor. I1 may be either a positive or negative current. Current I2 is applied to the Second Conductor and is independent from the current I1 which is applied to the First Conductor. Current I2 may be either a positive or negative current.

The resultant, total magnetic field (H) created by the Coil, through which an electron beam will pass, will be directly proportional to the number of turns in the First Conductor times I1, plus the number of turns in the Second Conductor times I2. Since the wires are wound as a pair, the number of turns in the First Conductor equals the number of turns in the Second Conductor. Thus the magnetic field (H) will be equal to a constant, times the number of turns of the pair of wires, times the sum of I1 and I2. Deflection of a charged beam such as an electron beam, is directly proportional to the cross product of the magnet field (H) and the velocity of the electrons. Simplifying we can write a general relation that the magnetic field (H) to cause the desired deflection of an electron beam is equal to the sum of the current I1 through the First Conductor and the current I2 through the Second Conductor, times a proportionality constant K.

$$H = K*I1 + K*I2 = K(I1+I2) \qquad \text{Equation 1}$$

The power (P) dissipated by the Coil made up of the First Conductor and the Second Conductor is sum of the resistance of the First Conductor times the square of current I1 through the First Conductor plus the resistance of the Second Conductor times the square of the current I2 through the Second Conductor. The resistance of a wire is a function of the cross sectional area (or gage) of a wire and its length. When the gauge and length of both wires are the same, as in this case, the resistance of the First Conductor equals the resistance of the Second Conductor. We will call this resistance R. Therefore, the power dissipated by the magnetic coil is equal to the resistance of either coil times the sum of the squares of I1 and I2. This can be written as:

$$P = R*I1^2 + R*I2^2 = R(I1^2 + I2^2) \qquad \text{Equation 2}$$

Solving the two simultaneous Equations 1 and 2 above, the current output as a function of desired magnetic field is:

$$I1 = \frac{H/K + SQRT\left[2P/R - (H/K)^2\right]}{2} \qquad \text{Equation 3}$$

and $$I2 = \frac{H/K - SQRT\left[2P/R - (H/K)^2\right]}{2} \qquad \text{Equation 4}$$

Where "SQRT" represents square root. It is very straightforward for an engineer with skill in the art to construct an analog circuit to perform the operations in Equation 3 and Equation 4. An example of such an analog method is shown in FIG. 1.

FIG. 1 shows analog generation of Equations 3 and 4 in block diagram form:

A voltage representing the desired deflection ($V_D$) is input into analog circuit (1). Analog circuit (1) is a voltage to current transform circuit which transforms the input voltage ($V_D$) into an output current (H/K) and outputs that current. (H/K) is applied to the input of both analog circuit (2) and analog circuit (3). The output current of analog circuit (2) is current I1 which is a function of (H/K), P, and R according to Equation 3. I1 is the desired current, according to Equation 3, to apply to the First Conductor (4A) of coil (D4) in FIG. 4, First Conductor (4C) of coil (L4) in FIG. 5, First Conductor (4E) of coil (C4) in FIG. 6, the First Conductor (4G) of coil (S4) in FIG. 7, or the First Conductor (4J) of coil (G4) in FIG. 8.

As noted above, (H/K) is also applied to the input of analog circuit (3). The output current of analog circuit (3) is current I2 which is a function of (H/K), P, and R according to Equation 4. I2 is the desired current, according to Equation 4, to apply to the Second Conductor (4B) of coil (D4) in FIG. 4, Second Conductor (4D) of coil (L4) in FIG. 5, Second Conductor (4F) of coil (C4) in FIG. 6, the Second Conductor (4H) of coil (S4) in FIG. 7, or the Second Conductor (4K) of (G4) in FIG. 8.

Figure 2:
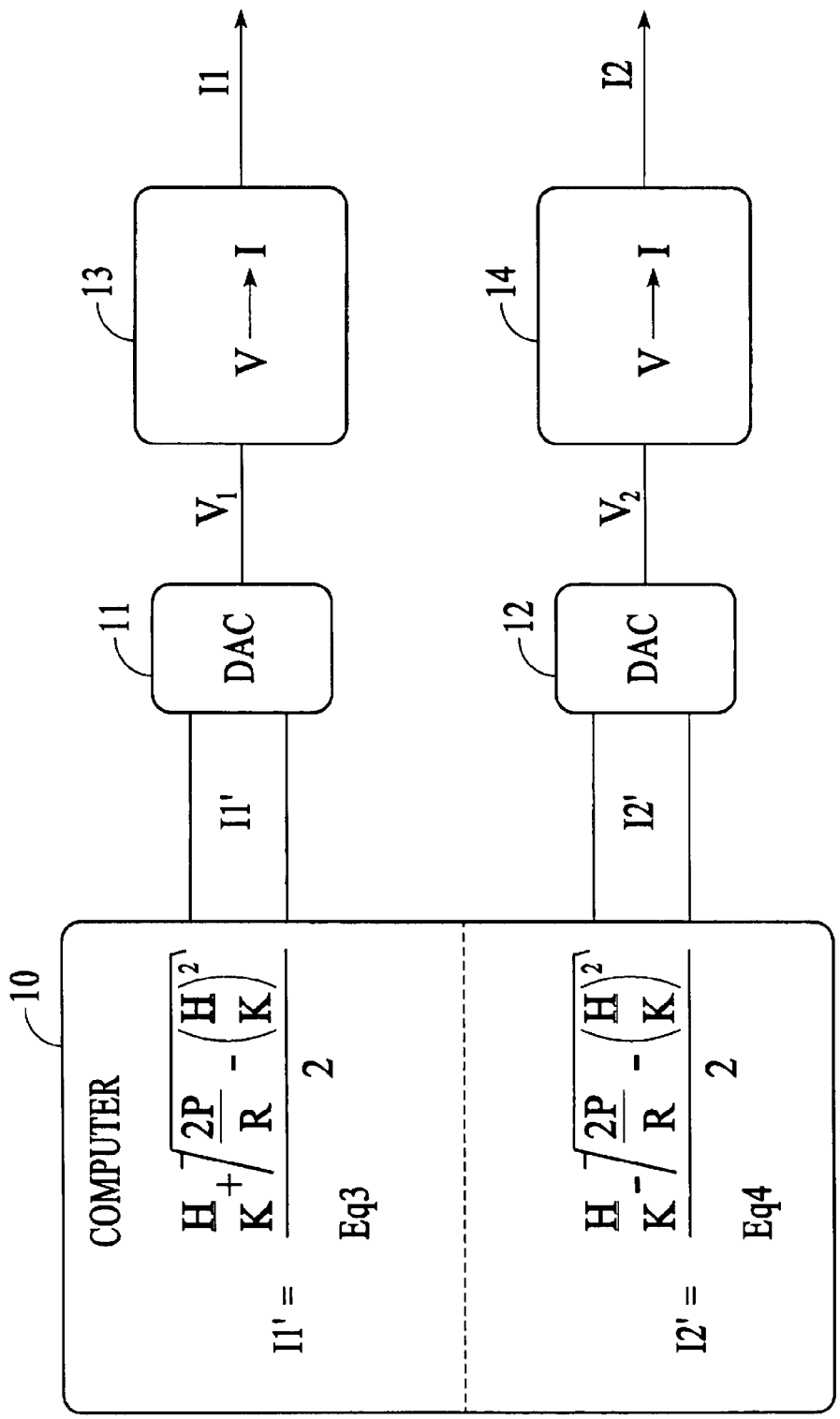
FIG. 2 shows in block form the computer generation of Equations 3 and 4 in the form of digital signal which are then converted to voltages via DACs and currents via voltage to current converters.

FIG. 2 shows the generation of Equations 3 and 4 by computer in block diagram form: Equation 3 and 4 may both be implemented by using a computer to calculate the current based on the desired deflection, according to Equation 1 and 2 then outputting the result digitally to a DAC for each conductor. The voltage output by the DACs can then be applied to a circuit which would output to each of the respective coils, a current directly proportional to the voltage. This method would be particularly useful where the desired magnetic field produced by a coil is changed slowly, on the order of micro seconds, followed by long dwell times, again on the order of micro seconds, as in a vector particle beam system. An example of this method is shown in FIG. 2.

Computer (10) calculates a digital number, I1'. I1' is a digital number satisfying Equation 3. That digital number I1' is applied to a digital to analog converter, DAC (11). The output of DAC (11) is a voltage, V1 which is proportional to I1'. Analog circuit (13) is a voltage to current converter circuit which transforms the input voltage (V1) into an output current I1, and outputs that current. I1 is the desired current, according to Equation 3, to apply to the First Conductor (4A) of coil (D4) in FIG. 4, First Conductor (4C) of coil (L4) in FIG. 5, First Conductor (4E) of coil (C4) in FIG. 6, the First Conductor (4G) of coil (S4) in FIG. 7 or the First Conductor (4J) of coil (G4) in FIG. 8.

Computer (10) also calculates I2' which is a digital number satisfying Equation 4. That digital number I2' is applied to a digital to analog converter, DAC (12). The output of DAC (12) is a voltage, (V2) which is proportional to I2'. Analog circuit (14) is a voltage to current converter circuit which transforms the input voltage (V2) into an output current I2 and outputs that current. I2 is the desired current, according to Equation 4, to apply to the Second Conductor (4B) of coil (D4) in FIG. 4, Second Conductor (4D) of coil (L4) in FIG. 5, Second Conductor (4F) of coil (C4) in FIG. 6, the Second Conductor (4H) of coil (S4) in FIG. 7, or the Second Conductor (4K) of (G3) in FIG. 8.

This example shows two busses for transmitting the digital numbers I1' and I2'. This could also be accomplished by multiplexing these two digital signals onto a single bus and then de-multiplexing them to apply to separate DACs 11 and 12.

Figure 3:
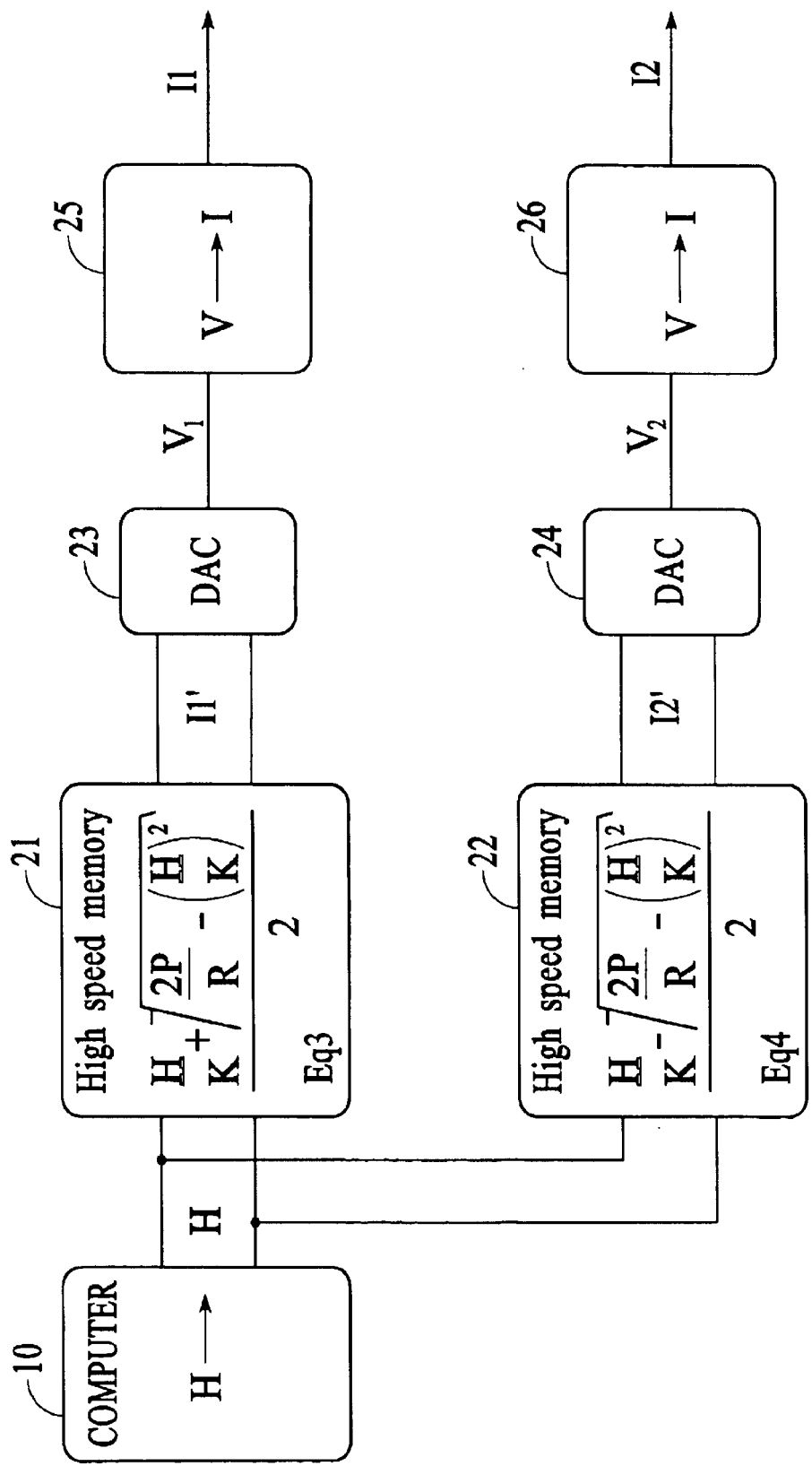
FIG. 3 shows in block form the computer generation of a digital signal which represents the desired magnetic field and the conversion of that digital number into numbers representative of Equations 3 and 4 by look up tables contained in high speed memory IC's.

FIG. 3 shows the generation of Equations 3 and 4 by use of a look up table in block diagram form. This method would be to construct a lookup table which contains values representing the desired output current for each address, according to Equations 3 and 4. The desired current would be output in the form of a digital number which is as an address in the lookup table. The values at the address would then represent the values which satisfy Equation 3 and Equation 4. Again these numbers would be output to DACs which would convert the numbers to the desired current. An example of this is shown in FIG. 3. The advantage of this method is that it can be faster than calculating the numbers in a computer.

Computer (10) calculates a digital number, (H). (H) is a digital number which represents the desired magnetic field. Digital number (H) is applied as an address to lookup table IC 21 contained in any form of high speed addressable memory device. Some examples of a high speed addressable memory devices include such devices as static or dynamic RAM (Random Access Memory), a PROM (Programmable Read Only Memory), an EPROM (Erasable programmable Read Only Memory), an EEPROM (Electrically Erasable programmable Read Only Memory), etc. The number at address (H) of lookup table IC 21 is a digital number that satisfies the Equation 3. The digital number at address (H) of lookup table IC 21 is output as a digital number I1'. That digital number I1' is applied to a digital to analog converter, DAC (23). The output of DAC (23) is a voltage, V1 which is proportional to I1'. Analog circuit (25) is a voltage to current converter circuit which transforms the input voltage (V1) into an output current I1 and outputs that current. I1 is the desired current, according to Equation 3, to apply to the First Conductor (4A) of coil (D4) in FIG. 4, First Conductor (4C) of coil (L4) in FIG. 5, First Conductor (4E) of coil (C4) in FIG. 6, the First Conductor (4G) of coil (S4) in FIG. 7 or the First Conductor (4J) of coil (G4) in FIG. 8.

Digital number (H) is also applied as an address to lookup table IC 22. The number at address (H) of lookup table IC 22 is a digital number that satisfies the Equation 4. The digital number at address (H) of lookup table IC 22 is output as a digital number I2'. That digital number I2' is applied to a digital to analog converter, DAC (24). The output of DAC (24) is a voltage, V2 which is proportional to I2'. Analog circuit (26) is a voltage to current converter circuit which transforms the input voltage (V2) into an output current I2 and outputs that current. I2 is the desired current, according to Equation 4, to apply to the Second Conductor (4B) of coil (D4) in FIG. 4, Second Conductor (4D) of coil (L4) in FIG. 5, Second Conductor (4F) of coil (C4) in FIG. 6, the Second Conductor (4H) of coil (S4) in FIG. 7, or the Second Conductor (4K) of (G3) in FIG. 8.

The example in FIG. 3 shows two separate, high speed memory devices, IC 21 and IC 22. The memory could also all be contained on a single IC where the corresponding values which satisfy Equations 3 and 4 are both stored at the same address.

FIGS. 1–3 are presented as representative examples for generating currents according to Equations 3 and 4 while satisfying Equations 1. Any combination or permutation of the above examples as well as many other methods for generating currents according to Equations 3 and 4 are well known to design engineers in the art and can be implemented without resort to undue experimentation.

Figure 4:
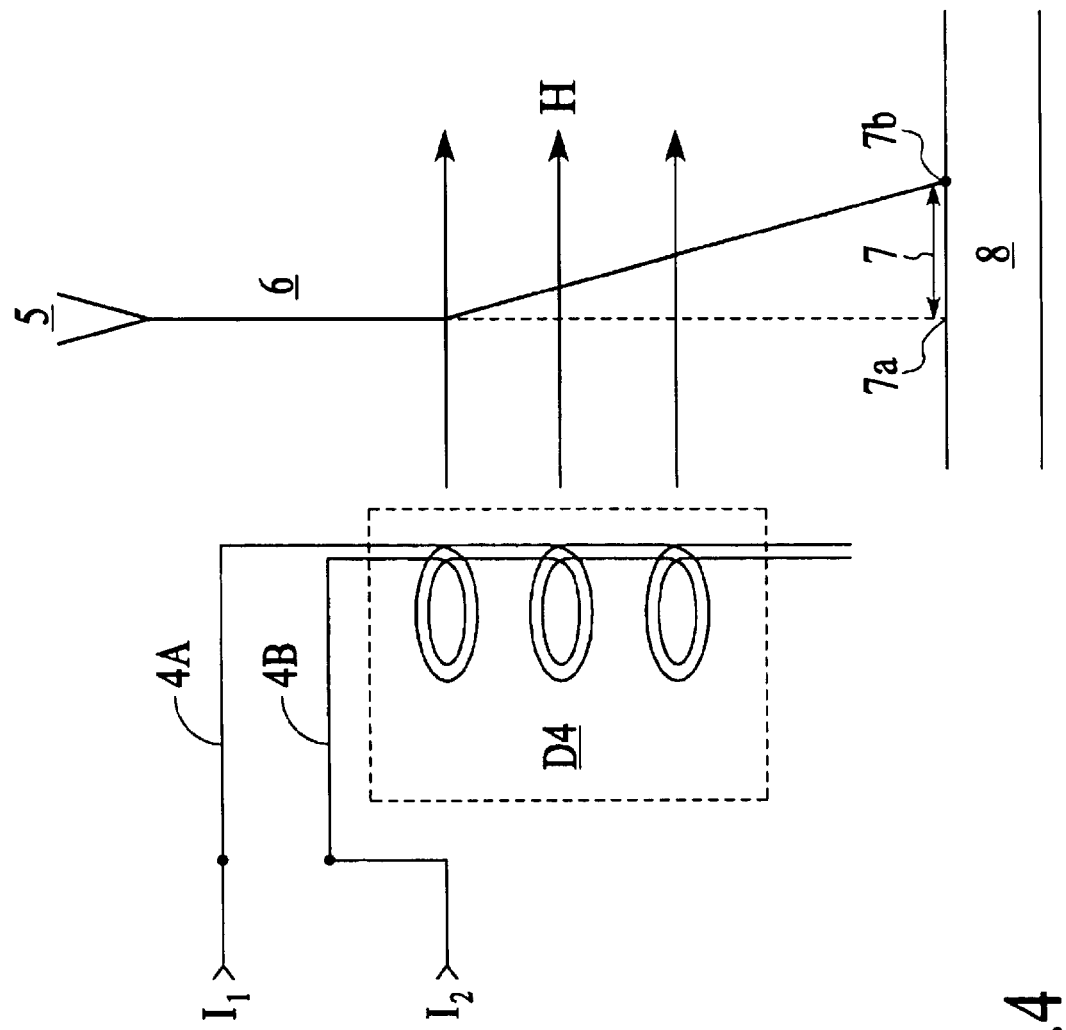
FIG. 4 shows the application of currents generated according to Equations 3 and 4 to a deflection coil.

Deflection Coil: A deflection coil is used to deflect the path of a particle beam to a desired position on a substrate. FIG. 4 shows the application of this invention in block diagram form, as applied to a deflection coil.

Current I1 is applied to Conductor (4A) which is the First Conductor of deflection coil (D4). Conductor (4A) is wound into deflection coil D4, parallel to Conductor (4B) and through the same path. Conductor (4A) is electrically independent of Conductor (4B). Current I2 is applied to Conductor (4B) which is the Second Conductor of deflection coil (D4). Conductor (4B) is wound into deflection coil (D4), parallel to Conductor (4A) and through the same path. Conductor (4B) is electrically independent of Conductor (4A).

Current I1 in the First Conductor and current I2 in the Second Conductor each generate magnetic fields which add algebraically to generate a net magnetic field (H) according to Equation 1. Additionally, currents I1 and I2 satisfy Equations 3 and 4 respectively for maintaining a constant application of power over a wide range of net magnetic fields and are generated by the circuits such as those in the examples of FIGS. 1–3. Alternatively, currents I1 and I2 satisfy Equations 7 and 8 respectively for maintaining a constant application of power over a wide range of net raster amplitudes and can be generated by the circuits such as those in the examples of FIGS. 12–15.

Charged particle beam source (5) emits a charged particle beam (6) along a path which passes through the net magnetic field (H) generated by coil (D4) which is composed of coils (4A) and (4B). The net magnetic field (H) deflects a moving charged particle beam (6) a distance (7) at the surface of substrate (8). The beam strikes the substrate (8) at a point (7B). Undeflected, the beam would strike the surface of the substrate at point (7a).

Figure 5:
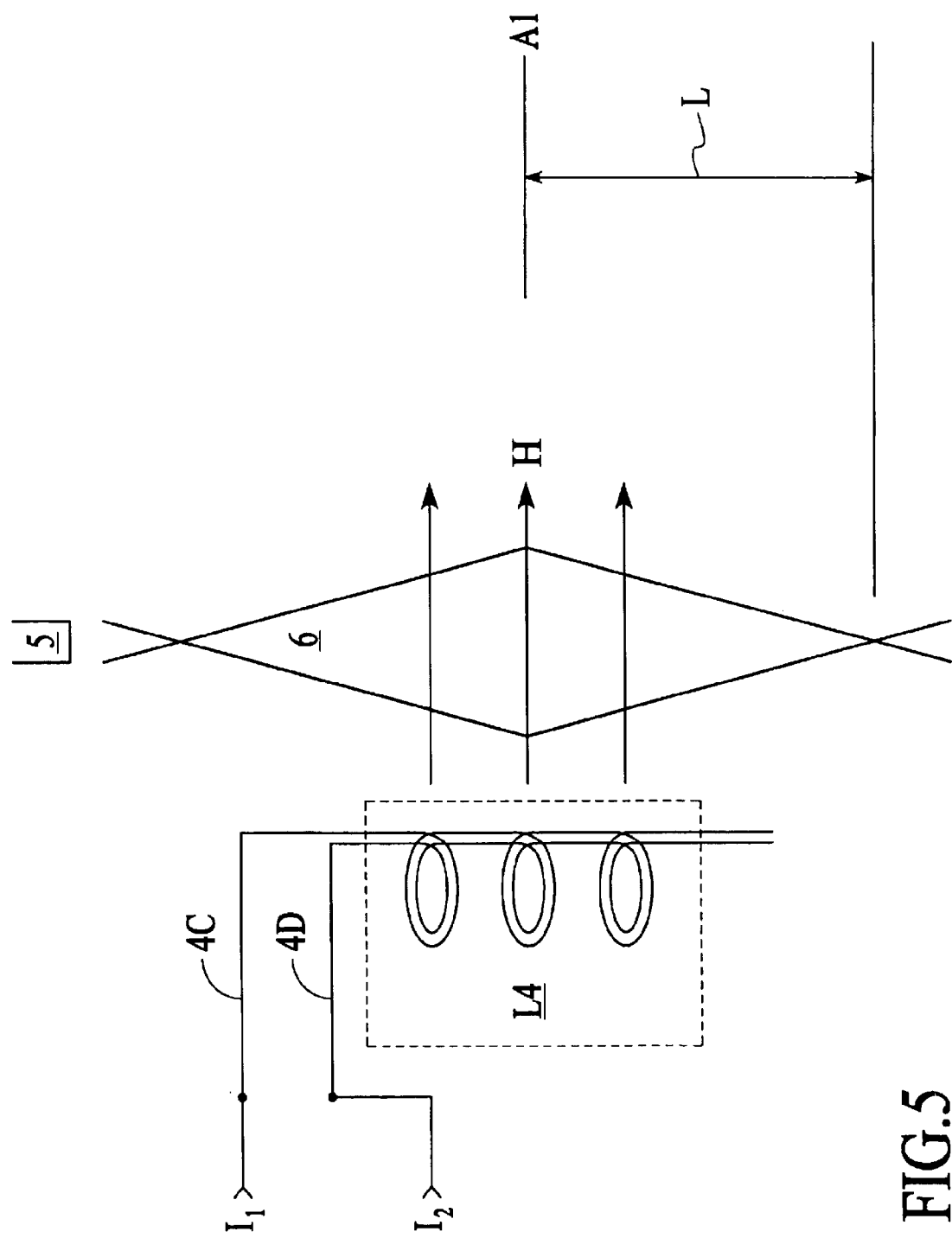
FIG. 5 shows the application of currents generated according to Equations 3 and 4 to a lens coil.

Lens Coil: A lens coil is used to focus a particle beam at some distance L from the axis of the lens coil. FIG. 5 shows the application of this invention in block diagram form, as applied to a lens coil.

Current I1 is applied to Conductor (4C) which is the First Conductor of lens (L4). Conductor (4C) is wound into lens coil L4, parallel to Conductor (4D) and through the same path. Conductor (4C) is electrically independent of Conductor (4D). Current I2 is applied to Conductor (4D) which is the Second Conductor of lens coil (L4). Conductor (4D) is wound into lens L4, parallel to Conductor (4C) and through the same path. Conductor (4D) is electrically independent of Conductor (4C).

Current I1 in the First Conductor and current I2 in the Second Conductor each generate a magnetic field which adds algebraically to generate a net magnetic field (H) according to Equation 1. Additionally, currents I1 and I2 satisfy Equations 3 and 4 respectively for maintaining a constant application of power over a wide range of net magnetic fields and are generated by the circuits of FIGS. 1–3.

Charged particle beam source (5) emits a charged particle beam (6) along a path which passes through the net magnetic field (H) generated by lens coil (L4) which is composed of coils (4C) and (4D). The net magnetic field (H) focuses a moving charged particle beam (6) a distance (L) from the axis (A1) of lens L4.

Figure 6:
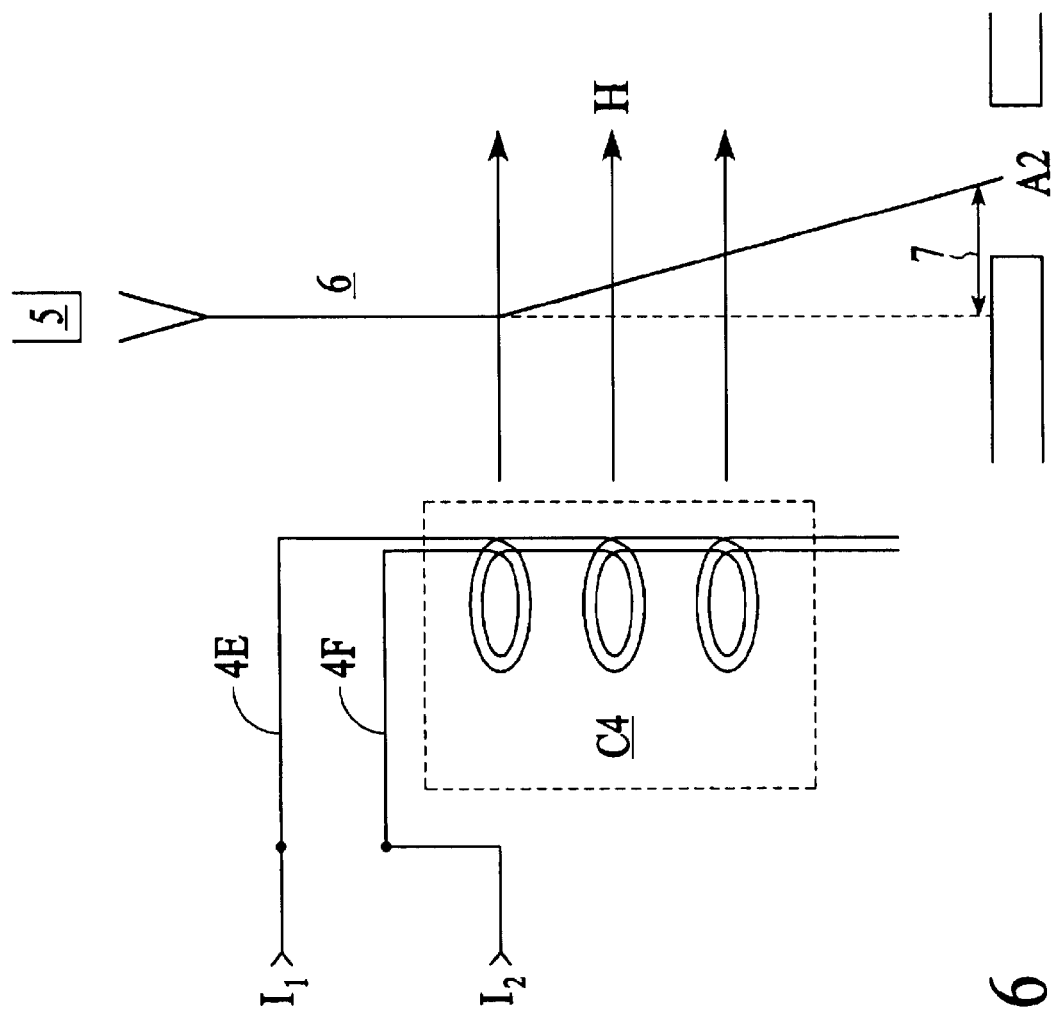
FIG. 6 shows the application of currents generated according to Equations 3 and 4 to a centering coil.

Centering Coil: Centering coils are deflection type coils and are used mainly to move a beam interior to the column and position it with respect to apertures or lenses. FIG. 6 shows the application of this invention to centering coils, in block diagram form.

Current I1 is applied to Conductor (4E) which is the First Conductor of centering coil (C4). Conductor (4E) is wound into centering coil (C4), parallel to Conductor (4F) and through the same path. Conductor (4E) is electrically independent of Conductor (4F). Current I2 is applied to Conductor (4F) which is the Second Conductor of centering coil (C4). Conductor (4F) is wound into centering coil (C4), parallel to Conductor (4E) and through the same path. Conductor (4F) is electrically independent of Conductor (4E).

Current I1 in the First Conductor and current I2 in the Second Conductor each generate a magnetic field which adds algebraically to generate a net magnetic field (H) according to Equation 1. Additionally, Currents I1 and I2 satisfy Equations 3 and 4 respectively for maintaining a constant application of power over a wide range of net magnetic fields and are generated by the circuits of FIGS. 1–3. Alternatively, currents I1 and I2 satisfy Equations 7 and 8 respectively for maintaining a constant application of power over a wide range of raster magnetic fields and can be generated by the circuits of FIGS. 12–15.

Charged particle beam source (5) emits a charged particle beam (6) along a path which passes through the net magnetic field (H) generated by centering coil (C4) which is composed of first and second conductors (4E) and (4F) respectively. This net magnetic field (H) deflects the moving charged particle beam (6) a distance (7) at the plane of an aperture (A2), to position the beam within an aperture (A2), as in the example of FIG. 6. The beam could also be positioned with respect to the optical axis of a lens or some other component of a column.

Figure 7:
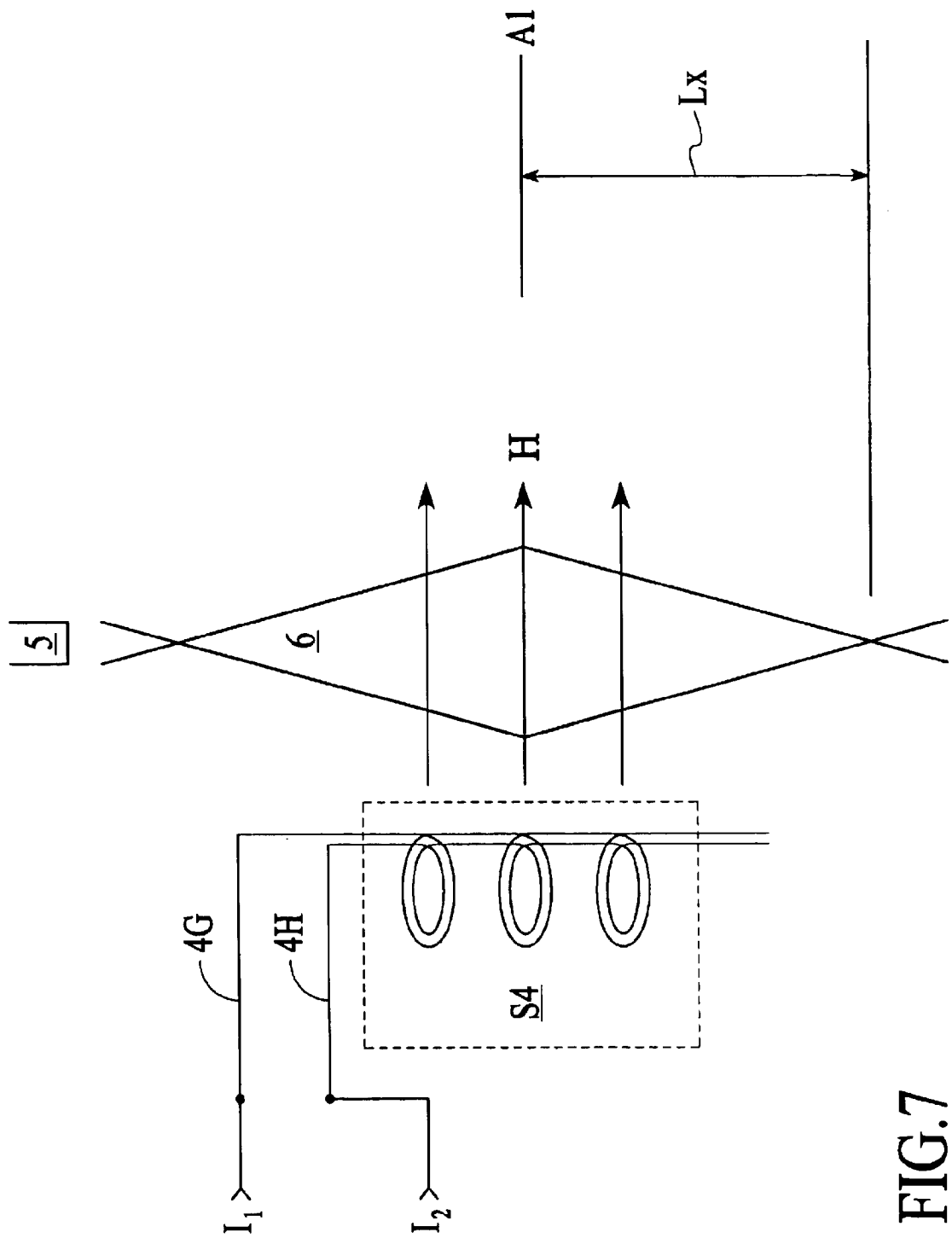
FIG. 7 shows the application of currents generated according to Equations 3 and 4 to a stigmation coil.

Stigmation Coils: Stigmation coils are a set of octapoles, or stigmation poles, which focus a charged particle beam in one axis independently of the other axis. FIG. 7 shows the application of this invention to stigmation pole which is a component of a stigmation coil, in block diagram form.

Current I1 is applied to Conductor (4G) which is the First Conductor of stigmation pole (S4). Stigmation pole (S4) is one pole (or coil) of the stigmation coil made up of octapoles. Conductor (4G) is wound into pole S4 , parallel to Conductor (4H) and through the same path. Conductor (4G) is electrically independent of Conductor (4H). Current I2 is applied to Conductor (4H) which is the Second Conductor of stigmation pole (S4). Conductor (4H) is wound into stigmation pole (S4), parallel to Conductor (4G) and through the same path. Conductor (4H) is electrically independent of Conductor (4G).

Current I1 in the First Conductor and current I2 in the Second Conductor each generate a magnetic field which adds algebraically to generate a net magnetic field (H) in Equation 1. Additionally, Currents I1 and I2 satisfy Equations 3 and 4 respectively for maintaining a constant application of power over a wide range of net magnetic fields and are generated by the circuits of FIGS. 1–3. The net magnetic field focuses a moving charged particle beam (6) a distance (Lx) from the center (A1) of stigmation pole (S4)

Figure 8:
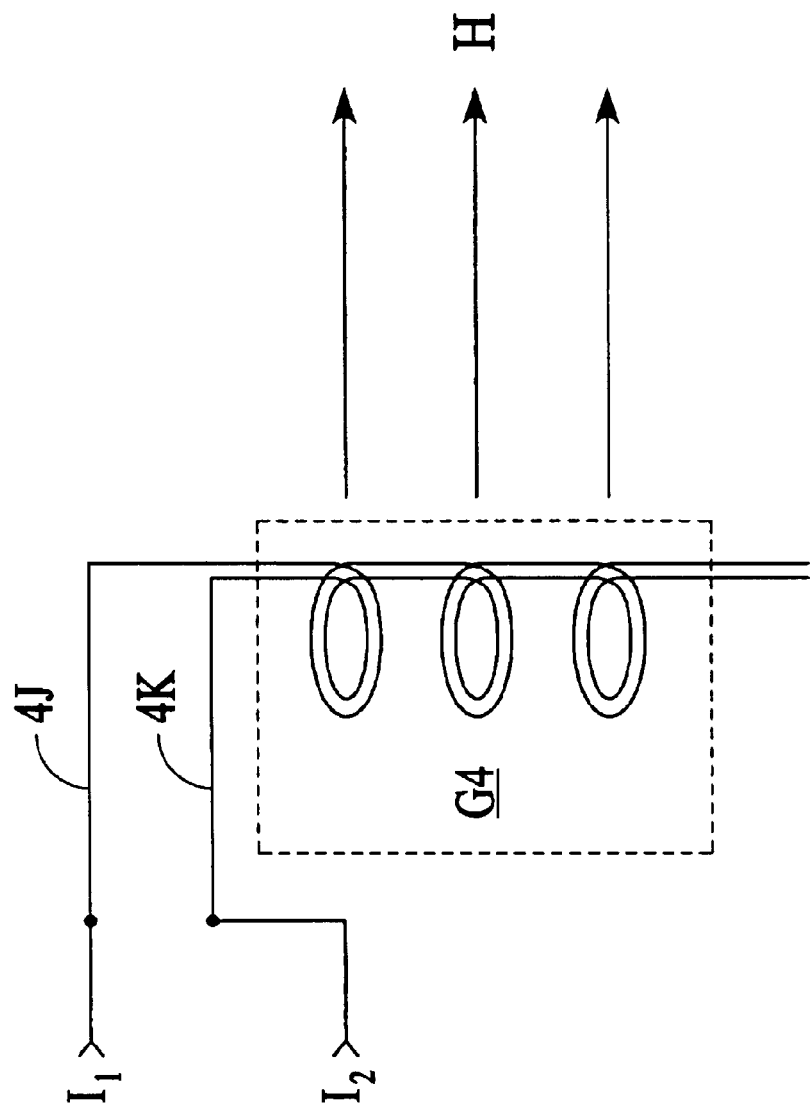
FIG. 8 shows the application of currents generated according to Equations 3 and 4 to a general magnetic field producing coil.

General Magntic Coil: FIG. 8 shows the application of this invention to the general magnetic coil, in block diagram form. This invention applies to any coil in general which is used to create a magnetic field.

Current I1 is applied to Conductor (4J) which is the First Conductor of general coil (G4). General coil (G4) represents magnetic coils in general. Conductor (4J) is wound into coil (G3), parallel to Conductor (4K) and through the same path. Conductor (4J) is electrically independent of Conductor (4K).

Current I2 is applied to Conductor (4K) which is the Second Conductor of deflection coil (G4). Conductor (4K) is wound into general coil (G4), parallel to Conductor (4J) and through the same path. Conductor (4K) is electrically independent of Conductor (4J).

Current I1 in the First Conductor and current I2 in the Second Conductor each generate a magnetic field which adds algebraically to generate a net magnetic field (H) in Equation 1. This net magnetic field can be used for any purpose including but not limited to servo motors, relays, electric motors, linear motors, etc. Additionally, currents I1 and I2 satisfy Equations 3 and 4 respectively for maintaining a constant application of power over a wide range of net magnetic fields and are generated by the circuits of FIGS. 1–3. Alternatively, currents I1 and I2 satisfy Equations 7 and 8 respectively for maintaining a constant application of power over a wide range of net raster amplitudes and can be generated by the circuits of FIGS. 12–15.

FIGS. 4 through 8 are intended to represent coils and magnetic fields in a block diagram form. They do not represent the actual geometry of the coils or the magnetic fields generated by the coils, except that the conductor pairs follow the same path as they are wound into a coil.

Average Power in Repeating Waveforms

A repeating wave form is often applied to a coil, such as a deflection coil. In the case of a deflection coil, for example, the repeating wave form is used to generate a raster. The period of this wave form is typically much, much shorter than the time it takes for the coil or the system to react thermally to the instantaneous power. Typical wave forms might have a period which is on the order of a few micro seconds to milliseconds, while it might take seconds to minutes for a coil, and the system it is a part of, to change temperature in response to power changes. In this case, we are interested in the average power applied to the coil since it is the average power applied to the coil that will determine its temperature, not the instantaneous power. As long as the wave form continues repeating at the same amplitude, the average power applied to the coil is constant.

Figure 9:
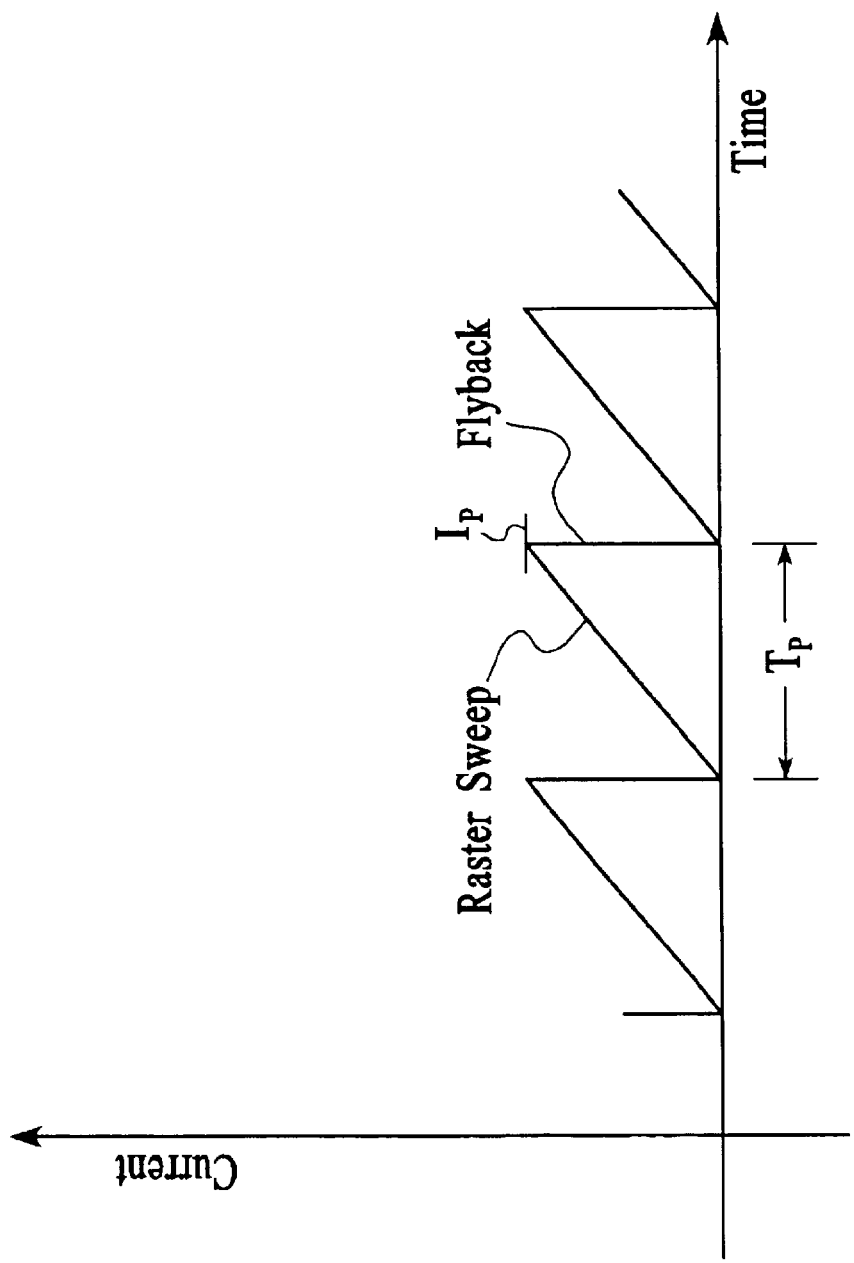
FIG. 9 shows a raster wave form.

One typical repeating wave form is a raster wave form. A raster wave form is a repeating saw-tooth type of wave form as depicted in FIG. 9. The vertical axis is current. The horizontal axis is time. "Ip" denotes the peak current. Tp is the period of the saw-tooth. The region which sweeps or rasters a particle beam is labeled "Raster Sweep". At the end of the Raster is the region which returns the beam to its starting point. It is labeled "Flyback". A raster is used to sweep a particle beam across the substrate. It is well understood in electronics arts, through the application of straight forward calculus, that the average power ($P_{avg}$) generated by a saw-tooth current waveform is proportional to the peak current squared, times the resistance, divided by three, as represented in Equation 5.

$$P_{avg} = \frac{R I p^2}{3\ Ka} \quad \text{Equation 5}$$

Combining Equation 2 with Equation 5, we can rewrite Equation 2 as Equation 6, for the average power of a raster or saw-tooth current wave form.

$$P_{avg} = \frac{R I p 1^2}{3\ Ka} + \frac{R I p 2^2}{3\ Ka} = \frac{R(I p 1^2 + I p 2^2)}{3\ Ka} \quad \text{Equation 6}$$

Where $P_{avg}$ is the average power, Ka is a proportionality constant, R is the resistance of the coils and where Ip1 is the peak current of a saw-tooth wave form applied to a first conductor, and Ip2 is the peak current of a saw-tooth wave form applied to a second conductor, as discussed above.

The same is true of a triangle wave form, which is the general case of a saw-tooth wave form where the fly back region is not instantaneous. However, we are still interested in the instantaneous magnetic field generated by a coil made up of a First Conductor and a Second Conductor. The instantaneous magnetic field is still directly proportional to the current. So, when Ip1 and Ip2 are the peak currents and K is the proportionality constant, the peak magnetic field is still given by Equation 1.

$$H=K(Ip1+Ip2) \quad \text{Equation 1a}$$

Where (H) is the peak magnetic field and Ip1 and Ip2 are the peak currents of the First Conductor and the Second Conductor respectively.

The two simultaneous Equations 1a and 6 above, can be solved, by making the appropriate substitutions. The peak current output as a function of desired peak magnetic field for a saw-tooth or triangle wave form is:

$$Ip1 = \frac{H/K + SQRT\left[6KaP_{avg}/R - (H/K)^2\right]}{2} \quad \text{Equation 7}$$

and $$Ip2 = \frac{H/K - SQRT\left[6KaP_{avg}/R - (H/K)^2\right]}{2} \quad \text{Equation 8}$$

Reconsidering the above description, Equation 7 can be used in the place of Equation 3, in all cases where a saw-tooth or triangle wave form is applied to first conductors (4A), (4C), (4E), (4G), and (4J) of coils D4, L4, C4, S4, and (G3) respectively. Reconsidering the above description, Equation 8 can be used in the place of Equation 4, in all cases where a saw-tooth or triangle wave form is applied to second conductors (4B), (4D), (4F), (4H), and (4K) of coils D4, L4, C4, S4, and G4 respectively.

Average Power Applied to Generation of Analog Ramp

This greatly simplifies the design considerations required to design a circuit that will produce the correct current inputs to the first and second conductors of the coils. For example, an analog saw-tooth wave form can be produced by standard methods well known by practitioners in the art. The saw-tooth wave form can then be applied to a multiplying circuit where the second term of the multiplying circuit satisfies Equation 7 to produce Ip1 and Equation 8 to produce Ip2. Note that in the following discussion, I1 and I2 are the actual current outputs of ramps or triangle wave forms, where Ip1 and Ip2 are the respective peak currents of the ramps or triangle wave forms.

Figure 10:
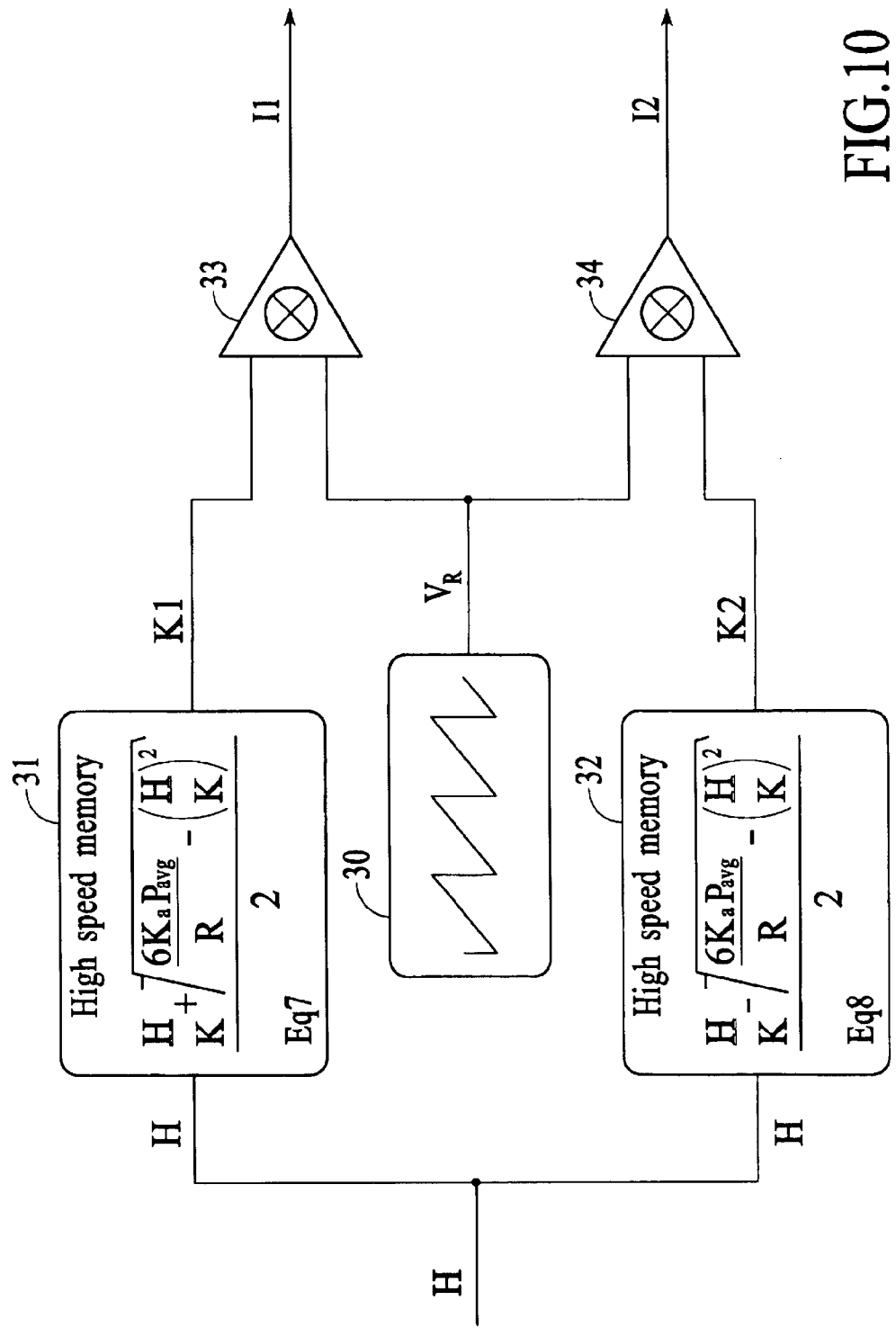
FIG. 10 shows in block diagram form analog generation of currents I1 and I2 from Equations 7 and 8.

FIG. 10 is a block diagram of an analog circuit for producing I1 and I2 according to Equations 7 and 8 respectively, with analog circuitry. Circuits that generate ramps where the peak is a function of a reference voltage are well understood in the industry and are standard circuits for machines that use a raster. In FIG. 10, a saw-tooth wave form is generated by such a circuit, represented by circuit (30). This saw-tooth is output as ramping voltage VR.

H is a voltage representing the desired magnetic field. Circuit (31) takes as its input the desired magnetic field, H. Circuit (33) generates a term K1 which when multiplied by ramping voltage $V_R$ will produce I1 according to Equation 7. Circuit (33) is a multiplying circuit that multiplies $V_R$ times K1. The output of circuit (33) is ramp current I1.

Circuit (32) takes as its input the desired magnetic field, H. Circuit (34) generates a term K2 which when multiplied by ramping voltage $V_R$ will produce I2 according to Equation 8. Circuit (32) is a multiplying circuit that multiplies $V_R$ times K2. The output of circuit (34) is ramp current I2.

The circuitry necessary to perform the functions of blocks (31), (32), (33), and (34) are standard circuits which are well known to practitioners in the electronics industry.

Average Power Generated by Computer Calculations

Another method of producing I1 and I2 according to Equations 7 and 8 respectively would be to calculate desired peak current by computer. The computer would then output a digital number proportional to the desired peak current. That digital number would be applied to a DAC. The output of the DAC would be a reference voltage which represents the desired peak amplitude above. That reference voltage would be input to a ramp generating circuit. Circuits that generate ramps where the peak is a function of a reference voltage are well understood in the industry and are standard circuits for machines that use a raster. A typical example is an R-C integrating circuit which integrates a square wave. The integral of a square wave is a ramp. The ramp generating circuit will generate a current ramp with the desired peak current according to Equation 7 or 8. An example of this is shown in FIG. 11.

Figure 11:
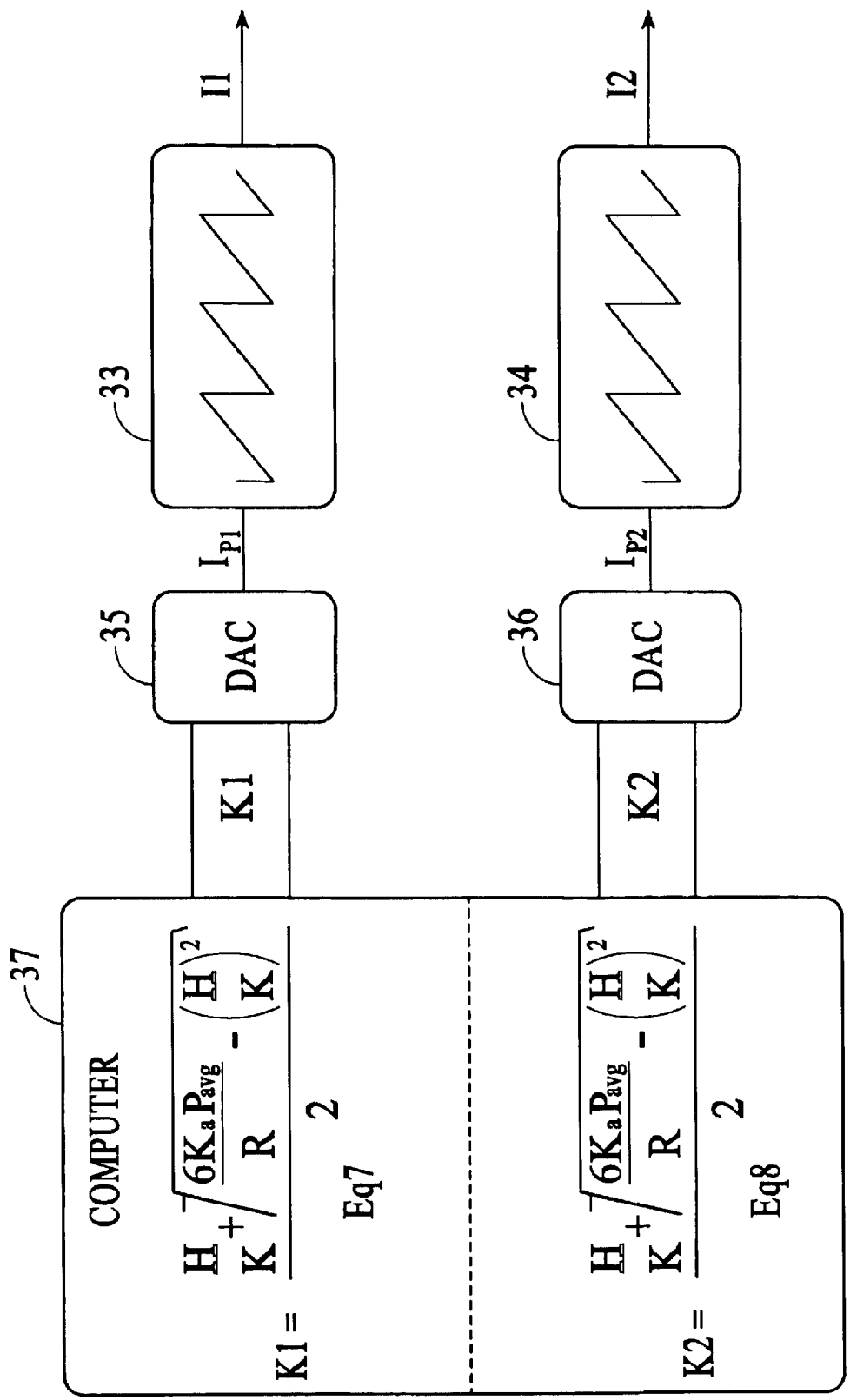
FIG. 11 shows in block form the computer generation of Equations 7 and 8 in the form of digital signals which are then converted to voltages via DACs and applied as reference voltages to ramp generators to produce current wave forms I1 and I2.

FIG. 11 shows computer (37) which calculates a digital number K1 which is proportional to a peak current according to Equation 7. K1 is output from the computer and applied to DAC (35). DAC (35) produces Ip1, which is a reference voltage proportional to the desired peak current, according to Equation 7. Ip1 is input as a reference voltage to circuit (33) which is a current ramp generating circuit. Circuit (33) outputs current I1 which is in the form of a ramp or triangle wave with a peak current according to Equation 7.

The computer also calculates a digital number K2 which is proportional to a peak current according to Equation 8. K2 is output from the computer and applied to DAC (36). DAC (36) produces Ip2, which is a reference voltage proportional to the desired peak current, according to Equation 8. Ip2 is input as a reference voltage to circuit (34) which is a current ramp generating circuit. Circuit (34) outputs current I2 which is in the form of a ramp or triangle wave with a peak current according to Equation 8.

Average Power Calculated by Computer, Applied to Multiplying DAC

Figure 12:
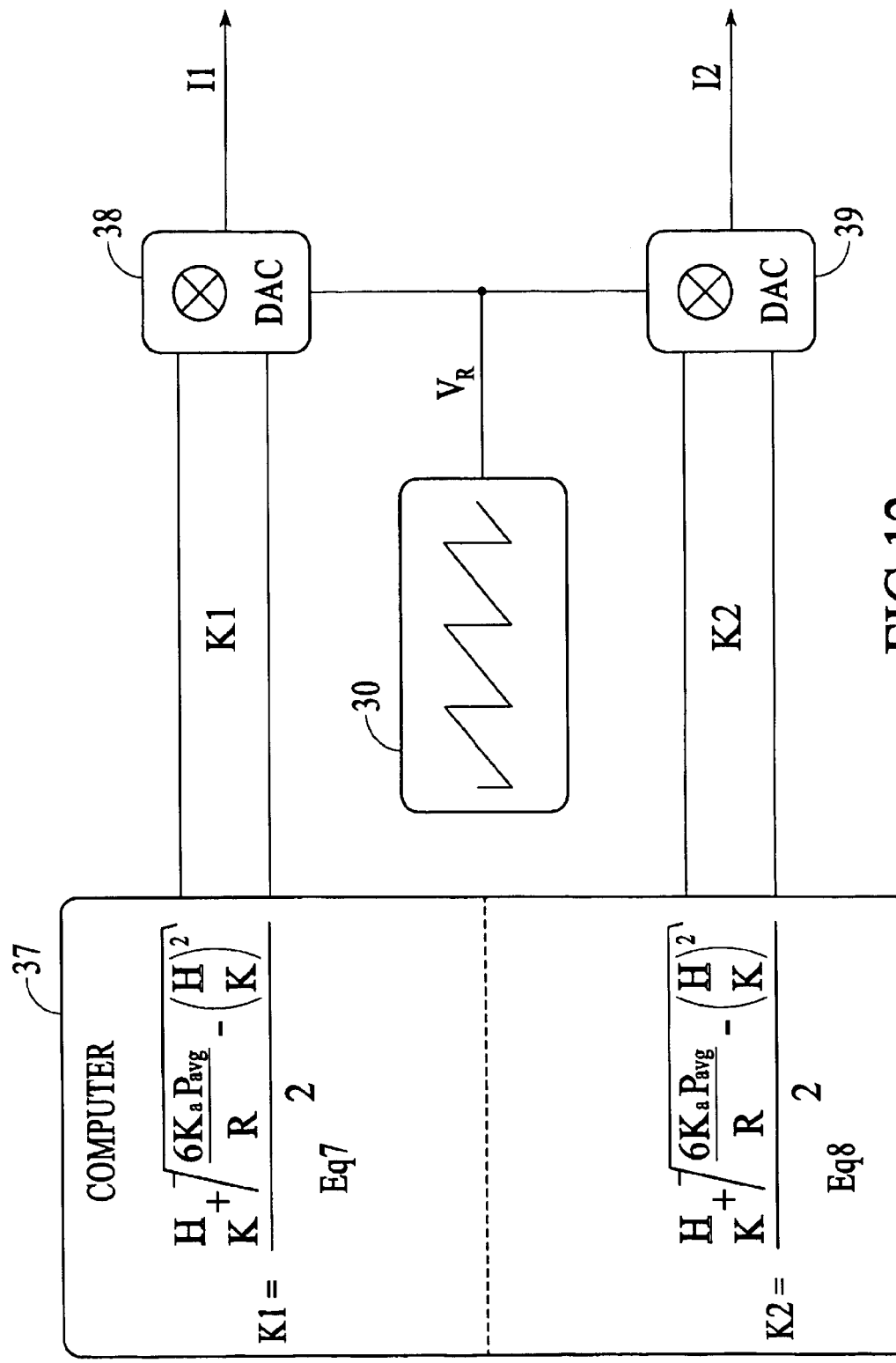
FIG. 12 shows in block form the computer generation of Equations 7 and 8 in the form of digital signals which are then converted to voltages via multiplying DACs. A ramp is the other input of the multiplying DAC. The outputs of the multiplying DAC's are current wave forms I1 and I2.

Another variation is to use multiplying DAC's instead of discreet DAC's and multiplying circuits. In this case, the multiplying circuit is contained within the multiplying DAC itself. Circuits that generate ramps where the peak is a function of a reference voltage are well understood in the industry and are standard circuits for machines that use a raster. In FIG. 12, a saw-tooth wave form is generated by such a circuit, represented by circuit (30). This saw-tooth is output as ramping voltage $V_R$. $V_R$ is the other input to the multiplying DAC. An example if this is shown in FIG. 12.

FIG. 12 shows a block diagram of a digital computer used to output digital numbers to multiplying DAC's. Digital Computer (37) calculates K1, according to Equation 7, and outputs K1 as a digital number. K1 is a digital input to Multiplying DAC (38). Multiplying DAC (38) multiplies the digital value of K1 times $V_R$ which is a saw-tooth wave form generated by circuit (30). The output is the desired current I1, according to Equation 7.

Digital Computer (37) calculates K2, according to Equation 8, and outputs K2 as a digital number. K2 is a digital input to Multiplying DAC (39). Multiplying DAC (39) multiplies the digital value of K2 times $V_R$ which is a saw-tooth wave form generated by circuit (30). The output is the desired current I2, according to Equation 8.

Average Power Addressed in Memory Look-up Table

Another method of producing I1 and I2 according to Equation 7 and 8 respectively is to output the desired magnetic field (H) from a computer as an address of a high speed addressable memory device. Some examples of high speed addressable memory devices include such devices as static or dynamic RAM (Random Access Memory), PROM (Programmable Read Only Memory), EPROM (Erasable programmable Read Only Memory), EEPROM (Electrically Erasable programmable Read Only Memory), etc. The memory location would contain digital numbers K1 and K2 which could then be output to DAC's to produce reference voltages Ip1 and Ip2 which are proportional to the peak of the ramp current according to Equation 7 and 8 respectively. Ip1 and Ip2 are then applied to ramp generating circuits as reference voltages. The output of the ramp generating circuits are ramps with peak currents according to Equations 7 and 8. An example of this is shown in block diagram form in FIG. 13.

Figure 13:
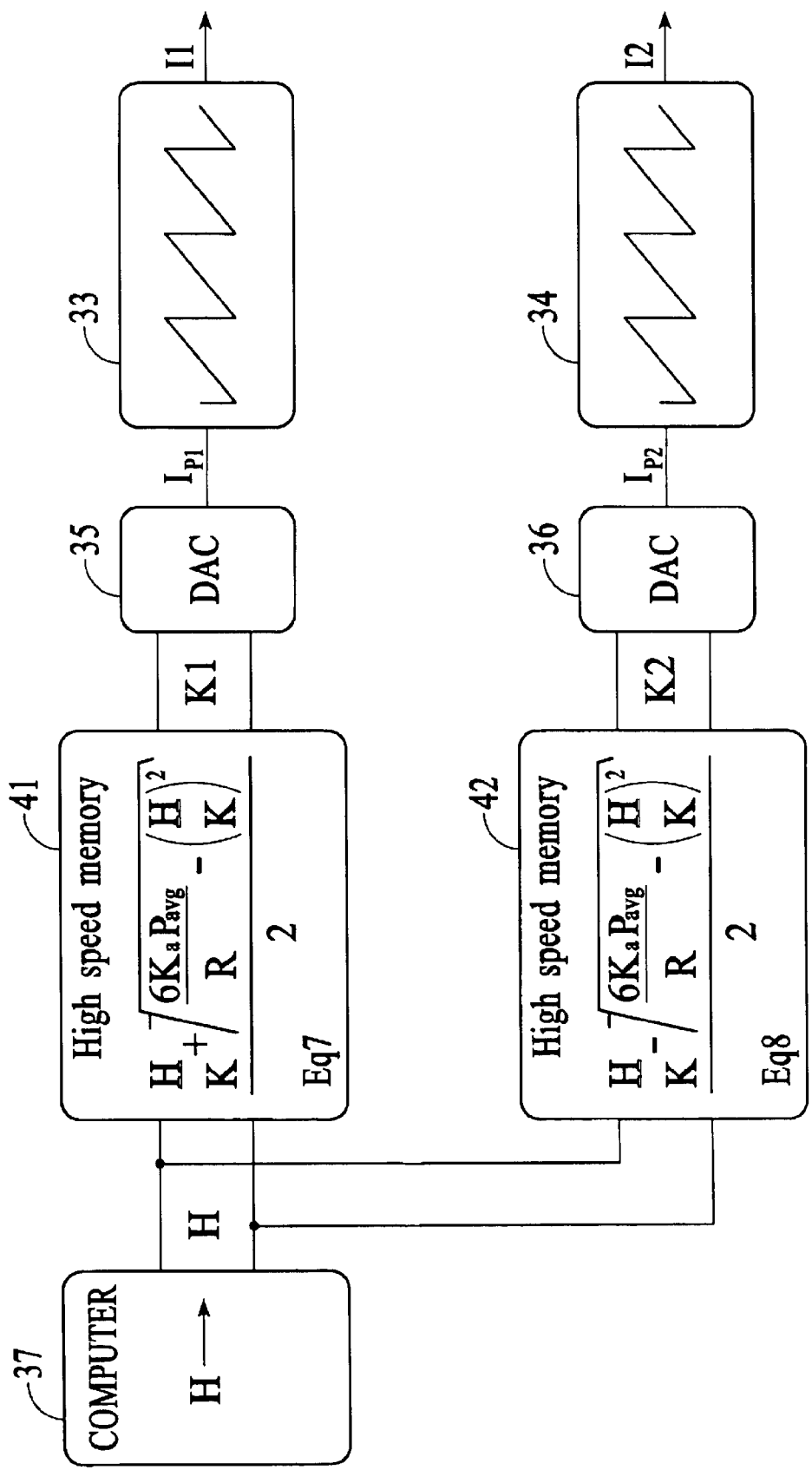
FIG. 13 shows in block form the computer generation of a digital signal which represents the desired magnetic field and the conversion of that digital number into numbers representative of Equations 7 and 8 by look up tables contained in semiconductor memory then the application of those number to DAC's and finally the generation of current wave forms I1 and I2.

FIG. 13 shows computer (37) which outputs a digital number (H) representing the desired magnetic field. (H) is applied to High Speed Memory device, or Memory IC (41) as an address. The address (H) in Memory IC (41) contains a digital number K1 which is proportional to a peak current according to Equation 7. K1 is output from Memory IC (41) and applied to DAC (35). DAC (35) produces Ip1, which is a reference voltage proportional to the desired peak current, according to Equation 7. Ip1 is input as a reference voltage to circuit (33) which is a current ramp generating circuit. Circuit (33) outputs current I1 which is in the form of a ramp or triangle wave with a peak current according to Equation 7.

H is also applied to Memory IC (42) as an address. The address (H) in Memory IC (42) contains a digital number K2 which is proportional to a peak current according to Equation 8. K2 is output from Memory IC (42) and applied to DAC (36). DAC (36) produces Ip2, which is a reference voltage proportional to the desired peak current, according to Equation 8. Ip1 is input as a reference voltage to circuit (34) which is a current ramp generating circuit. Circuit (34) outputs current I2 which is in the form of a ramp or triangle wave with a peak current according to Equation 8.

Force at Constant Temperature

In the case of electric motors, certain types of electric motors are constructed such that a current is applied to a wire which is in a magnetic field. A force is exerted on a wire carrying a current in a magnetic field. That force is directly proportional to the current in the wire. This can be represented by Equation 9:

$$K*F=I \qquad \text{Equation 9}$$

Where F is the force on the wire and K is a proportionality constant. An equal and opposite force would be exerted on the apparatus producing the magnetic field. Typically the wire is in the form of a coil. As in the above discussions regarding deflection coils and lenses, a motor coil is normally wound with a single continuous strand of wire. In this invention, a motor coil is wound in the normal manner except that multiple strands of parallel wires are wound through the same path that the single strand would have been wound. Again, for the sake of simplicity we will treat the case where only two wires are used. The wires are kept in intimate physical, but not electrical, contact throughout winding such that they are following the same path at all times. The intimate physical contact assures that heat energy is transferred uniformly and quickly. Preventing electrical contact is necessary such that the coils may be energized independently. It is not necessary that both wires be of the same gage but again, for the sake of simplicity, we will consider the case where both strands are of the same gauge. One continuous strand will make up the First Conductor. A second continuous strand will make up the Second Conductor. The ends of the First Conductor and the Second Conductor are kept separate for connecting to separate circuits.

A current I1 is applied to the First Conductor and is independent from a current I2 which is applied to the Second Conductor. Circuit A will provide I1 which is applied to the First Conductor. I1 may be either a positive or negative current. Circuit B will provide I2 which is applied to the Second Conductor. I2 may be either a positive or negative current.

The resultant force on the coil made up of Coils A and B will be equal to the sum of the current I1 through the First Conductor and the current I2 through the Second Conductor, times a proportionality constant K.

$$F=K(I1+I2) \qquad \text{Equation 11}$$

The power (P) dissipated by the motor coils is sum of the resistance of the First Conductor times the square of current I1 through the First Conductor plus the resistance of the Second Conductor times the square of the current I2 through the Second Conductor. The resistance of a wire is a function of the cross sectional area of a wire and its length. When the gauge and length of both wires are the same, as in this case, the resistance of the First Conductor equals the resistance of the Second Conductor. We will call this resistance R. Therefore, the power dissipated by the motor coil is equal to the resistance of either coil times the sum of the squares of I1 and I2. This can be written as:

$$P=RI1^2+RI2^2=R(I1^2+I2^2) \qquad \text{Equation 12}$$

Solving the two simultaneous Equations 11 and 12 above, the current output as a function of desired motor field is:

$$I1 = \frac{F/K + SQRT\left[2P/R - (F/K)^2\right]}{2} \qquad \text{Equation 13}$$

and $$I2 = \frac{F/K - SQRT\left[2P/R - (F/K)^2\right]}{2} \qquad \text{Equation 14}$$

Equations 13 and 14 may be substituted for Equations 3 and 4 respectively, in the above discussion regarding FIGS. 1, 2 and 3. The output currents I1 and I2 of the circuits in FIGS. 1, 2, and 3 may be then applied to the First Conductor and the Second Conductor of a motor coil, in a magnetic field.

Also as discussed above, a repeating wave form can be applied to a motor coil. For the case where the repeating wave form is a triangular wave, Equation 11 may be rewritten as Equation 15

$$F=K(Ip1+Ip2) \qquad \text{Equation 15}$$

Where (F) is the peak magnetic field and Ip1 and Ip2 are the peak currents of the First Conductor and the Second Conductor respectively.

Equation 6 above can be copied as Equation 16 for the case of the total power generated by a saw-tooth wave form applied to a pair of current elements in an externally induced magnetic field:

$$P_{avg} = \frac{RIp1^2}{3\,Ka} + \frac{RIp2^2}{3\,Ka} = \frac{R(Ip1^2 + Ip2^2)}{3\,Ka} \qquad \text{Equation 16}$$

Solving simultaneous Equations 15 and 16, in the same manner of Equations 13 and 14 yields Equations 17 and 18:

$$Ip1 = \frac{F/K + SQRT\left[6KaP_{avg}/R - (F/K)^2\right]}{2} \qquad \text{Equation 17}$$

and $$Ip2 = \frac{F/K - SQRT[6KaP_{avg}/R - (F/K)^2]}{2} \qquad \text{Equation 18}$$

General Considerations:

In the case of a triangle wave the average power is represented by Equation 6. However, the average power can be calculated for any repeating wave form. The most common repeating wave form would be a sinusoidal wave form. It is very straight forward to apply integral calculus to general physical principles to show that in the case of a sinusoidal current the average power is given by Equation 19:

$$P_{avg} = \frac{RIp^2}{2} \qquad \text{Equation 19}$$

Combining Equation 2 with Equation 19, we can rewrite Equation 2 as Equation 20, for the average power of a sinusoidal current wave form applied to a pair of conductors.

$$P_{avg} = \frac{RIp1^2}{2} + \frac{RIp2^2}{2} = \frac{R(Ip1^2 + Ip2^2)}{2} \qquad \text{Equation 20}$$

Recalling Equation 11 for the peak magnetic field (H), which still applies:

$$H = K(Ip1 + Ip2) \qquad \text{Equation 11}$$

We can solve simultaneous Equations 20 and 11 to give us:

$$Ip1 = \frac{H/K + SQRT[Pavg/R - (H/K)^2]}{2} \qquad \text{Equation 21}$$

and $$Ip2 = \frac{H/K - SQRT[Pavg/R - (H/K)^2]}{2} \qquad \text{Equation 22}$$

Equations 21 and 22 can be applied in place of Equations 7 and 8 respectively for repeating current wave forms that are sinusoidal, instead of saw-tooth or triangular. In the case of a force equation on a current element in an externally induced magnetic field, Equations 7 and 8 can be rewritten as Equations 23 and 24 respectively.

$$Ip1 = \frac{F/K + SQRT[Pavg/R - (H/K)^2]}{2} \qquad \text{Equation 23}$$

and $$Ip2 = \frac{F/K - SQRT[Pavg/R - (H/K)^2]}{2} \qquad \text{Equation 24}$$

Applying the principles of Forier Transforms it is well understood that any repeating, periodic wave form can be decomposed into a series of sinusoidal wave forms by choosing the amplitude, phase and period properly. Many wave forms can be represented exactly by Foriear components. Any wave form may be represented to an arbitrary degree of accuracy by the sum Forier components. Applying these principles to equations 23 and 24 above, any repeating, periodic wave form can be produced to an arbitrary degree of accuracy, and applied to a pair of conductors while maintaining the applied power at a desired level.

Even more generally for many repeating, periodic wave forms the average power can be written as:

$$P_{avg} = RJIp^2 \qquad \text{Equation 25}$$

Where J is a proportionality constant and Ip is the peak current of the wave form. We can combine Equation 2 with Equation 25, we to rewrite Equation 2 as Equation 26, for the average power of a repeating, periodic wave form.

$$P_{avg} = R*J*Ip1^2 + R*J*Ip2^2 = RJ(Ip1^2 + Ip2^2) \qquad \text{Equation 26}$$

Recall Equation 1a for peak magnetic field as a function of peak currents.

$$H = K(Ip1 + Ip2) \qquad \text{Equation 1a}$$

The two simultaneous Equations 1a and 26 can be solved, by making the appropriate substitutions. The peak current output as a function of desired peak magnetic field for a repeating, periodic wave form is:

$$Ip1 = \frac{H/K + SQRT[2P_{avg}/JR - (H/K)^2]}{2} \qquad \text{Equation 27}$$

and $$Ip2 = \frac{H/K - SQRT[2P_{avg}/JR - (H/K)^2]}{2} \qquad \text{Equation 28}$$

Reconsidering the above description, Equation 27 can be used in the place of Equation 3, in all cases where a repeating, periodic wave form is applied to first conductors (4A), (4C), (4E), (4G), and (4J) of coils D4, L4, C4, S4, and G4 respectively. Reconsidering the above description, Equation 28 can be used in the place of Equation 4, in all cases where a repeating, periodic wave form is applied to second conductors (4B), (4D), (4F), (4H), and (4K) of coils D4, L4, C4, S4, and G4 respectively.

More than two conductors can be used to make up the coils. However, the multiple conductors would still be wound in parallel, that is, they would follow the same path and be in intimate physical contact, but not electrical contact. Moreover, different gages of wire and numbers of turns can be used for the first, second, third, . . . nth conductor. It would be necessary to calculate the separate currents to apply to each of the conductors to meet the criterion that the sum power to the all of the coils is the desired value while the desired magnetic field is produced. While the derivations of the appropriate equations would be more complex, the relations would be based on basic principles equations of electronics. The derivations would well within the skills of practitioners skilled in the art to perform either analytically or numerically without undue experimentation.

In general, any coil used in an electrical device which follows a linear relation for the production of an effect and the square relation for the application of power could be substituted by a coil wound with a plurality of conductors, as discussed above and the application of currents to the conductors, as discussed above.

What is claimed is:

1. An electrical coil comprising:

a pair of electrical conductors having about;
   equal resistance,
   equal cross sectional area,
   equal length,
   wherein the electrical conductors, when assembled in parallel,
   follow about the same path,
   wherein the two electrical conductors
   are disposed in physical contact with each other along about the entire path,
   but are electrically separated; and a control circuit adapted to generate respective currents in each of electrical conductors, wherein the following conditions are satisfied,
   1) the respective electrical currents, when summed, will produce a desired resultant field, and
   2) a power resultant from one of the electrical currents and resistance of the respective electrical conductor, when summed with another power resultant from the other of the electrical currents and resistance of the respective electrical conductor, will produce a desired total power within the electrical coil.

2. An electrical coil placed in a magnetic field, the electrical coil comprising:

a pair of electrical conductors having about,
   equal resistance,
   equal cross sectional area,
   equal length,
   wherein the electrical conductors, when assembled in parallel,
   follow about the same path,
   wherein the two electrical conductors
   are disposed in physical contact with each other along about the entire path,
   but are electrically separated; and a control circuit adapted to generate:
   a current within one of the electrical conductors, and
   another current within the other of the electrical conductors,
   wherein the following conditions are satisfied,
   1) a force resultant from the interaction of the magnetic field with one of the electrical currents, when summed together with another force resultant from the interaction of the magnetic field with the other of the electrical currents, will produce a desired resultant force, and
   2) a power resultant from one of the electrical currents and the resistance of the respective electrical conductor, when summed together with another power resultant from the other of the electrical currents and the resistance of the respective electrical conductor, will produce a desired total power within the electrical coil.

3. The coil according to claim 1 wherein the control circuit comprises:

a digital computer adapted to calculate a value, proportional to the one of the electrical currents in one of the electrical conductors and another value, proportional to the other of the electrical currents in the other of the electrical conductors;

a digital to analog conversion circuit adapted to convert the calculated value for one of the electrical currents into to an analog signal and another digital to analog conversion circuit adapted to convert the calculated value for the other of the electrical currents into another analog signal and;

a circuit adapted to convert one of the analog signals into one of the electrical currents and apply it to the respective electrical conductor and another circuit adapted to convert the other of the analog signals into the other of the electrical currents and apply it to the other of the respective electrical conductor.

4. The coil according to claim 2 wherein the control circuit comprises:

a digital computer adapted to calculate a value, proportional to the one of the electrical currents in one of the electrical conductors and another value, proportional to the other of the electrical currents in the other of the electrical conductors;

a digital to analog conversion circuit adapted to convert the calculated value for one of the electrical currents into to an analog signal and another digital to analog conversion circuit adapted to convert the calculated value for the other of the electrical currents into another analog signal and;

a circuit adapted to convert one of the analog signals into one of the electrical currents and apply it to the respective electrical conductor and another circuit adapted to convert the other of the analog signals into the other of the electrical currents and apply it to the other of the respective electrical conductor.

* * * * *